(12) United States Patent
Mitsui et al.

(10) Patent No.: US 8,614,438 B2
(45) Date of Patent: Dec. 24, 2013

(54) PHOTOELECTRIC CONVERSION DEVICE, IMAGING DEVICE, METHOD FOR MANUFACTURING IMAGING DEVICE, AND IMAGING APPARATUS

(75) Inventors: Tetsuro Mitsui, Kanagawa (JP); Takashi Komiyama, Kanagawa (JP); Takuro Sugiyama, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 373 days.

(21) Appl. No.: 13/034,442

(22) Filed: Feb. 24, 2011

(65) Prior Publication Data
US 2011/0204208 A1 Aug. 25, 2011

(30) Foreign Application Priority Data
Feb. 25, 2010 (JP) ................................. 2010-041125

(51) Int. Cl.
*H01L 31/04* (2006.01)

(52) U.S. Cl.
USPC 257/40; 257/431; 257/E51.014; 257/E51.026; 257/E51.039

(58) Field of Classification Search
USPC ............. 257/40, 431, E51.014, E51.026, 257/E51.039; 438/82, 99
See application file for complete search history.

(56) References Cited

U.S. PATENT DOCUMENTS

| 8,012,530 B2 * | 9/2011 | Yoshikawa et al. ............. 427/74 |
| 8,269,099 B2 * | 9/2012 | Kitazawa et al. ............. 136/263 |
| 2005/0061364 A1 * | 3/2005 | Peumans et al. ............. 136/263 |
| 2009/0308458 A1 * | 12/2009 | Aramaki et al. ............. 136/263 |
| 2010/0006141 A1 * | 1/2010 | Oikawa et al. ................ 136/251 |
| 2010/0116312 A1 * | 5/2010 | Peumans et al. ............. 136/244 |
| 2011/0265877 A1 * | 11/2011 | Yoshikawa et al. ........... 136/263 |

FOREIGN PATENT DOCUMENTS

| JP | 11-054271 | | 2/1999 |
| JP | 2004-363577 | A | 12/2004 |
| JP | 2007-088033 | A | 4/2007 |
| JP | 2008-115460 | A | 5/2008 |
| JP | 2009-054794 | A | 3/2009 |
| JP | 2009-147147 | A | 7/2009 |
| JP | 2011199253 | A * | 10/2011 |

* cited by examiner

*Primary Examiner* — George Fourson, III
(74) *Attorney, Agent, or Firm* — Studebaker & Brackett PC

(57) ABSTRACT

An organic photoelectric conversion device having: a first electrode; a second electrode opposing to the first electrode; and an organic material-containing photoelectric conversion layer provided between the first electrode and the second electrode, wherein an electron spin number of the photoelectric conversion layer is not more than $1.0 \times 10^{15}/cm^3$.

30 Claims, 4 Drawing Sheets

PHOTOELECTRIC CONVERSION DEVICE, IMAGING DEVICE, METHOD FOR MANUFACTURING IMAGING DEVICE, AND IMAGING APPARATUS

CROSS-REFERENCE TO RELATED APPLICATION(S)

The present application claims priority from Japanese Patent Application No. 2010-041125 filed on Feb. 25, 2010, the entire content of which is incorporated herein by reference.

BACKGROUND

1. Field

The present invention relates to a photoelectric conversion device, an imaging device, a method for manufacturing an imaging device and an imaging apparatus.

2. Description of the Related Art

JP-A-2007-88033 discloses an organic photoelectric conversion device having a pair of electrodes and an organic compound-containing photoelectric conversion layer provided between the electrodes. The photoelectric conversion layer as referred to herein means a layer which receives light to generate a charge corresponding to the amount of received light. Also, JP-A-2009-147147 discloses an imaging device using such an organic photoelectric conversion device. Since performances such as high sensitivity and low dark current are required in the imaging device, high sensitivity and low dark current are also required as performances in the organic photoelectric conversion device.

In order to enhance the sensitivity, an enhancement of light absorption, an enhancement of exciton dissociation efficiency and an enhancement of transport properties of dissociated charges are necessary, respectively as performances of the photoelectric conversion layer. In general, in a photoelectric conversion layer of an organic solar cell, a technique for promoting the exciton dissociation on a junction surface between a p-type material and an n-type material is adopted. In particular, as a technique for increasing an junction area between the p-type material and the n-type material while ensuring a path of the dissociated charge, there is often adopted a technique for forming a layer (bulk hetero layer) having a p-type material and an n-type material mixed therein. However, when a photoelectric conversion material or a bulk hetero layer which is used in a photoelectric conversion layer in organic thin film solar cells or the like is applied to an imaging device as it is, in many cases, the dark current becomes large. It may be considered that this is related to a thermally excited carrier from HOMO of the p-type material to LUMO of the n-type material, and it may be considered that this is caused due to the matter that the carrier flows into an electrode due to an electric field impressed to the photoelectric conversion layer or existing in the inside of the photoelectric conversion layer.

Such a dark current in the organic photoelectric conversion device is caused due to a dark current by a charge to be injected from the electrode into the photoelectric conversion layer, a dark current by a free carrier upwelled in the photoelectric conversion layer, a current due to a physical short circuit such as partial leakage. As a countermeasure to the dark current to be injected from the electrode, there is a technology for inserting a charge blocking layer between the electrode and the photoelectric conversion layer. Also, as a countermeasure to the leakage, there is reduction of irregularities of the electrode, removal of dusts attached to a substrate, or the like. However, a method for effectively suppressing the dark current by the free carrier upwelled in the photoelectric conversion layer has not been known yet.

In an inorganic material, it is broadly known that a dangling bond becomes defective, so that it may become a carrier generation source. For example, JP-A-2009-54794 describes a possibility that with respect to an $SiO_x$ layer functioning as a hole blocking layer contained in the organic photoelectric conversion device, its defect becomes a carrier generation source.

JP-A-2008-115460 and JP-A-2004-363577 disclose that there is a correlation between a defect (dangling bond) in a photoelectric conversion layer (photoactive layer) in an inorganic solar cell and an electron spin density.

However, all of JP-A-2009-54794, JP-A-2008-115460 and JP-A-2004-363577 show a thought that there is a correlation between a defect (dangling bond) in an inorganic material layer and an electron spin density, but they do not consider how to suppress a free carrier which will possibly become a dark current source in a photoelectric conversion layer where a dangling bond does not exist (specifically, an organic material-containing photoelectric conversion layer).

SUMMARY

In view of the foregoing circumstances, the invention has been made, and its object is to provide an organic photoelectric conversion device capable of reducing a dark current, an imaging device including the same, an imaging apparatus including the same, and a method for manufacturing the imaging device.

The organic photoelectric conversion device of the invention is an organic photoelectric conversion device having a first electrode; a second electrode opposing to the first electrode; and an organic material-containing photoelectric conversion layer provided between the first electrode and the second electrode, wherein an electron spin number of the photoelectric conversion layer is not more than $1.0 \times 10^{15}/\text{cm}^3$.

The imaging device of the invention includes a plurality of the foregoing organic photoelectric conversion devices and a read-out part for reading out signals corresponding to charges generated in each of the photoelectric conversion devices.

The imaging apparatus of the invention includes the foregoing imaging device.

The method for manufacturing the imaging device of the invention is a method for manufacturing an imaging device having plural organic photoelectric conversion devices and a read-out part for reading out signals corresponding to charged generated in each of the plural organic photoelectric conversion devices, wherein the organic photoelectric conversion device includes a first electrode for collecting the charges; a second electrode opposing to the first electrode; and a photoelectric conversion layer which is provided between the first electrode and second electrode and which generates the charges corresponding to incident light, and wherein the photoelectric conversion layer is formed such that an electron spin number of the photoelectric conversion layer is not more than $1.0 \times 10^{15}/\text{cm}^3$.

According to the invention, it is possible to provide an organic photoelectric conversion device capable of reducing a dark current, an imaging device including the same, an imaging apparatus including the same and a method for manufacturing the imaging device.

DETAILED DESCRIPTION OF EXEMPLARY EMBODIMENTS

The present inventor made extensive and intensive investigations. As a result, it has been found that in an organic photoelectric conversion device having a pair of electrodes and an organic material-containing photoelectric conversion layer provided between the electrodes, there is a correlation between a dark current amount of the organic photoelectric conversion device in a state where a prescribed bias voltage is applied between the pair of electrodes and an electron spin number per $cm^3$ of the photoelectric conversion layer. More specifically, it has been found that when the electron spin number per $cm^3$ of the photoelectric conversion layer at room temperature (25° C.) is regulated to not more $1.0 \times 10^{15}$, and theoretically 0, it is able to reduce the dark current to a level on which there is no problem as an application for imaging device from the standpoint of practical use.

The electron spin number can be identified by means of ESR (electron spin resonance). Specifically, the electron spin number as referred to in this specification means a spin number identified by separating a signal waveform obtained upon being measured using an ESR measurement system into an isotropic signal and an anisotropic signal and integrating the isotropic signal component. For the ESR measurement, measures such as Q-band measurement and X-band measurement can be adopted.

The separation method the ESR signal is described in detail. After thin film fabrication of an organic film having a film thickness necessary for detecting signals on a PEN (polyethylene naphthalate) substrate, this PEN substrate is cut in an inert atmosphere without being exposed to the air, the cut PEN substrate is enclosed into a sample tube to prepare a sample, and this sample is subjected to a Q-band and X-band ESR analysis. So far as the signal amount is correctly estimated, the sample formation method is not limited to the foregoing embodiment.

Figure 3:
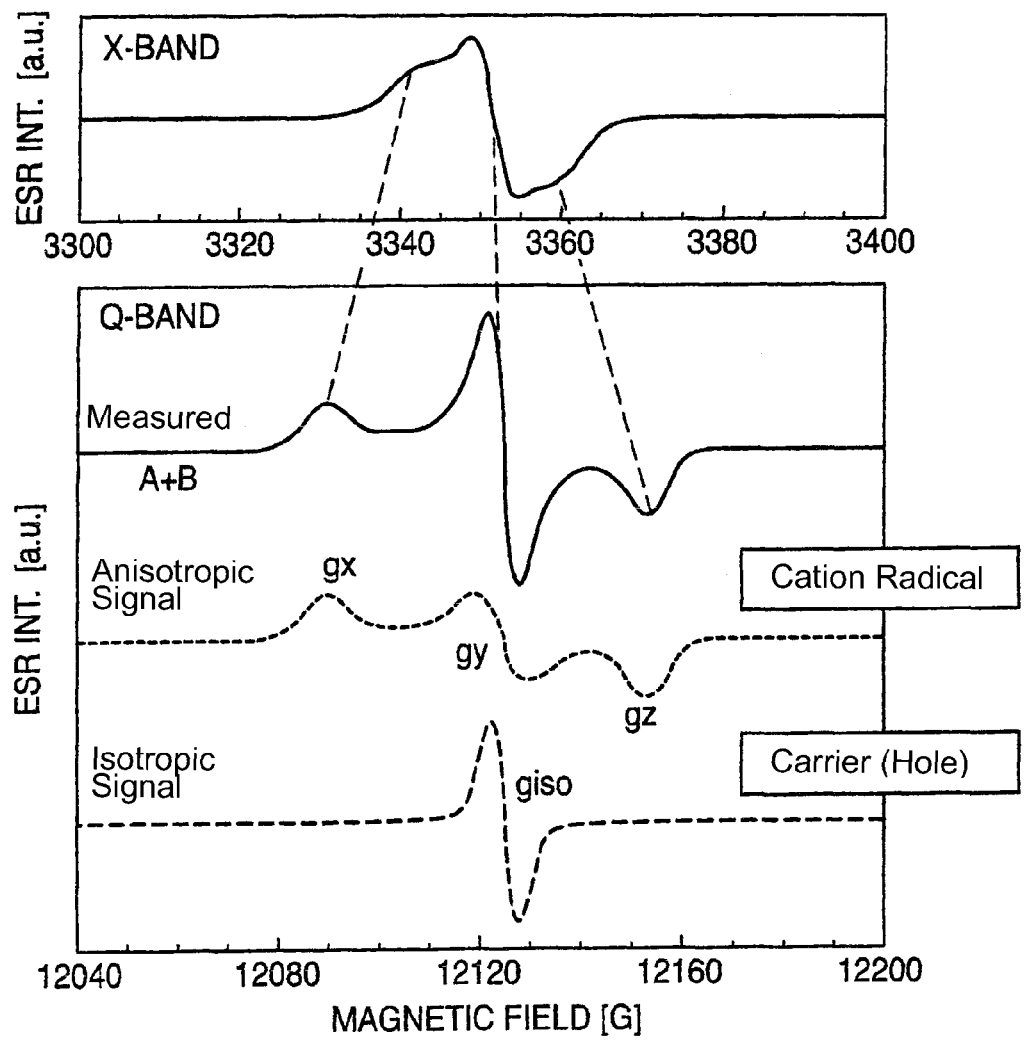
FIG. 3 is a schematic of X-band and Q-band ESR spectra measured with respect to a sample wherein the organic film contained in the sample is SnPc (tin phthalocyanine).

FIG. 3 shows X-band and Q-band ESR spectra measured with respect to a sample wherein the organic film contained in the sample is SnPc (tin phthalocyanine). In the Q-band ESR spectra, the signal waveform can be distinctly separated into a signal with anisotropy and a signal with isotropy. In view of the fact that average g values of the both are substantially equal to each other, it can be assumed that the both are paramagnetic species having an equal structure, and it may be considered that difference in shapes of signal spectra is derived from a difference in mobility of spin.

That is, it can be assumed that the anisotropic signal is corresponding to a SnPc cation radical (namely, a component which cannot freely move and which does not contribute to the dark current) in which the spin is localized among the SnPc molecules, whereas the isotropic signal is corresponding to a carrier (hole, namely a component which can freely move and which contributes to the dark current) in which the spin is delocalized among the SnPc molecules.

Figure 4:
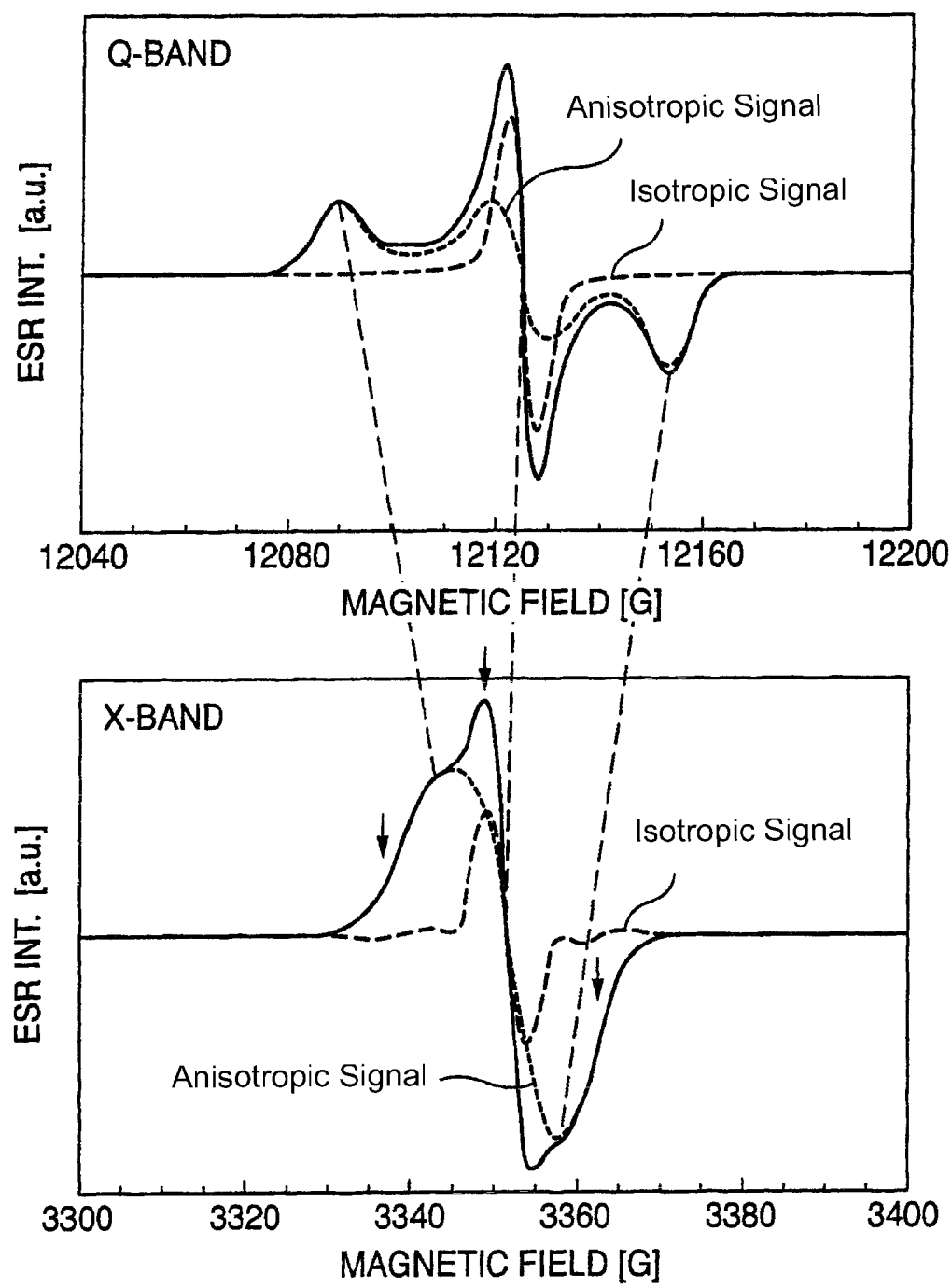
FIG. 4 is a schematic to illustrate X-band spectrum.

Accordingly, with respect to the component corresponding to the dark current, it is important to grasp this isotropic signal. Taking into account this viewpoint, in spectra of the X-band measurement, the signal waveform can be similarly separated into an isotropic signal and an anisotropic signal (see FIG. 4). In the invention, it has been found that the isotropic signal amount and the dark current amount are correlated with each other (see the working examples).

More specifically, it has been found that there is a correlation between the isotropic signal amount and the dark current. Namely, the smaller the isotropic signal amount (electron spin number), the smaller the dark current can be made.

With respect to the electron spin number, it is important to measure the film after thin film fabrication of a raw material constituting the photoelectric conversion layer but not the raw material per se. This is because the aggregation of molecules and the mixing state with other material are different between the state of the raw material such as a powder and the state after thin film fabrication of the raw material, so that there may be the case where the amount of the free carrier which can exist is different between the raw material and the photoelectric conversion layer. In particular, when the photoelectric conversion layer is a mixed layer of a p-type organic material and an n-type organic material, there may be the case where the electron spin number is large as compared with the case where the photoelectric conversion layer is formed of a single layer of the p-type organic material or n-type organic material. From this fact, it is also understandable that it is surely important to identify the electron spin number with respect to the layer in the same state as that in the device. Furthermore, when the vacuum heat vapor deposition method is adopted for forming the photoelectric conversion layer, since impurities contained in the raw material of the photoelectric conversion layer are different, there may be the case where the observed electron spin number is different between the raw material and the photoelectric conversion layer. For that reason, it is important to observe the electron spin number in the state after the photoelectric conversion layer has been fabricated.

It may be considered that the dark current derived from the free carrier generated in the photoelectric conversion layer is expressed by a product of a carrier amount (electron spin number in the invention), a mobility (resistance of the film) of the photoelectric conversion layer and an electric field intensity to be impressed to the photoelectric conversion layer. For that reason, it may be considered that the effect of the invention is revealed especially conspicuously in a state of a high mobility of the photoelectric conversion layer (in a state of a low resistance of the film) or in a state of a high impressed electric field intensity. In order to conspicuously reveal the effect of the invention, the mobility of the photoelectric conversion layer is preferably $1 \times 10^{-6}$ $cm^2/Vs$ or more, more preferably $1 \times 10^{-5}$ $cm^2/Vs$ or more, and still more preferably $5 \times 10^{-4}$ $cm^2/Vs$ or more.

As a constitution capable of realizing a photoelectric conversion layer having the foregoing mobility, a mixed layer of a p-type material and an n-type material is preferable. When the mixed layer of a p-type material and an n-type material is formed, and a path resulting from connection of p-type materials and a path resulting from connection of n-type materials are formed, the hole in the layer is transported into the path formed by the p-type materials, and the electron in the layer is transported into the path formed by the n-type materials. This is because the p-type material has a high hole mobility, and the n-type material has a high electron mobility. so that both the electron and the hole are rapidly transported in the foregoing layer, the layer resistance becomes small, and the contribution of the carrier amount in the photoelectric conversion layer (electron spin number in the invention) to the dark current becomes large.

That is, in the case of the single p-type material or the single n-type material, either one of hole transport properties or electron transport properties are high, with the remainder being low, and therefore, there is a tendency that the resistance of the layer is high, and the dark current value is relatively low. However, in that case, since optical signals are hardly transported, and a photoelectric conversion efficiency (amount of charges capable of being collected) decreases, there may be the case where the S/N is lowered. As described later, by taking the mixed layer of a p-type material and an n-type material, the exciton dissociation interface number in the layer increases, thereby enabling the sensitivity to be increased. However, in that case, a carrier due to thermal excitation is generated at the interface, resulting in an increase in the dark current. For that reason, it is important to minimize the electron spin number (carrier amount) in the photoelectric conversion layer as specified in the invention.

In the invention, the electron spin number per $cm^3$ of the photoelectric conversion layer at room temperature (25° C.) is preferably not more than $1.0 \times 10^{15}$, more preferably not more than $1 \times 10^{14}$, and still more preferably not more than $8 \times 10^{13}$.

In order to suppress the free carrier to be generated due to impurities or the like, with respect to the material per se to be used for the photoelectric conversion layer, when a risk of incorporation of a free carrier generation source such as impurities contained in the material into the photoelectric conversion layer is also taken into consideration, it is preferable that the own electron spin number of the material (the value identified in the state of the material as it is but not in the state where the material has been subjected to thin film fabrication) is small, and it may be considered that the electron spin number is preferably not more than $1.0 \times 10^{15}/cm^3$, more preferably not more than $1.0 \times 10^{14}/cm^3$, further preferably $8.0 \times 10^{13}/cm^3$.

However, as described previously, the own electron spin number of the material is not single-mindedly corresponding to the electron spin number in the layered state, and the electron spin number in the layered state is exactly important. Therefore, even when only the own electron spin number of the material is specified, the effects described in this specification cannot be always obtained.

In view of the fact that when light is irradiated on the organic photoelectric conversion device, a photoexcited free carrier is generated in the photoelectric conversion layer, it is desirable that the measurement of the electron spin number corresponding to the dark current is performed under shading conditions. Also, it is desirable that the measurement of the electron spin number is performed in the same environment as a drive environment (atmosphere) of the organic photoelectric conversion device. For example, on the assumption that the organic photoelectric conversion device is driven in an inert atmosphere, it is desirable that the measurement of the electron spin number is also performed in an inert atmosphere. This is because there may be the case where the state in the photoelectric conversion layer is strongly influenced by the atmosphere, for example, the case where when oxygen is present, this oxygen serves as a carrier trap or carrier generation source, whereby the observed electron spin number is different from the value in an inert atmosphere.

The smaller the thermally excited energy gap, or the larger the number of generation sources (thermal excitation sites), the more increased the internal carrier of the photoelectric conversion layer. In the imaging device, taking into consideration the matter that the drive temperature becomes high by the operation state or environment, it is desirable that the dark current amount is small in temperature dependency and does not increase even in a high temperature environment. For that reason, it is desirable that the electron spin number even in a high-temperature environment at 60° C. is not more than 3 times the value at room temperature (25° C.).

The imaging device that is an embodiment of the invention is hereunder described by reference to the accompanying drawings. This imaging device is mounted and used in imaging apparatuses such as digital cameras and digital video cameras, imaging modules in, for example, electron endoscopes or mobile phones, and so on.

Figure 1:
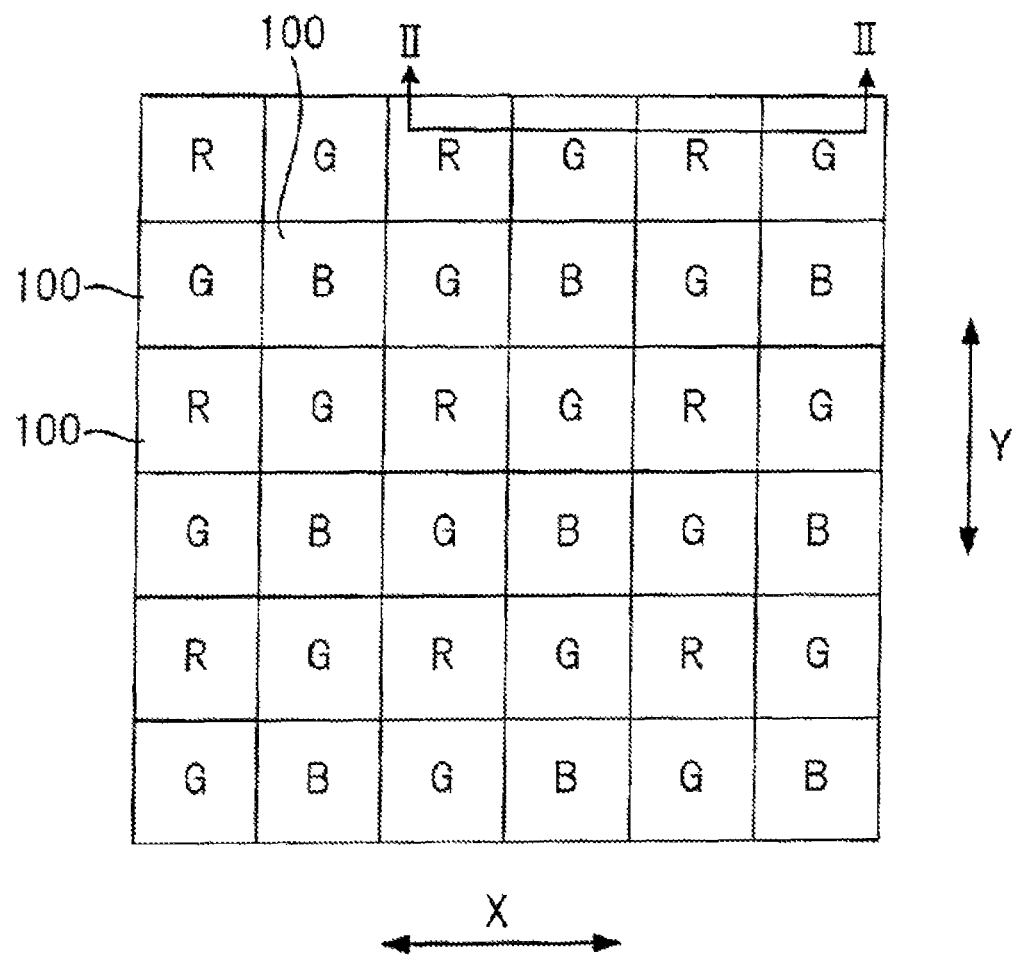
FIG. 1 is a schematic plan view showing a diagrammatic configuration of an imaging device for explaining an embodiment of the invention.

FIG. 1 is a schematic plan view showing a diagrammatic configuration of an imaging device for explaining an embodiment of the invention. In FIG. 1, 36 pixels in total of 6 lines×6 rows are illustrated.

An imaging device shown in FIG. 1 is provided with plural pixels 100 which are arranged in a line direction X and a row direction Y orthogonal to the line direction X on the plane in a two-dimensional shape (a tetragonal lattice shape in the illustrated example).

An R pixel for detecting red (R) light (symbolized by "R" in the drawing), a G pixel for detecting green (G) light (symbolized by "G" in the drawing) and a B pixel for detecting blue (B) light (symbolized by "B" in the drawing) are included in the plural pixels 100.

The example of FIG. 1 has such a disposition that an RG line where the R pixel and the G pixel are alternately arranged in the line direction X and a GB line where the G pixel and the B pixel are alternately arranged in the line direction X are alternately arranged in the row direction Y.

Figure 2:
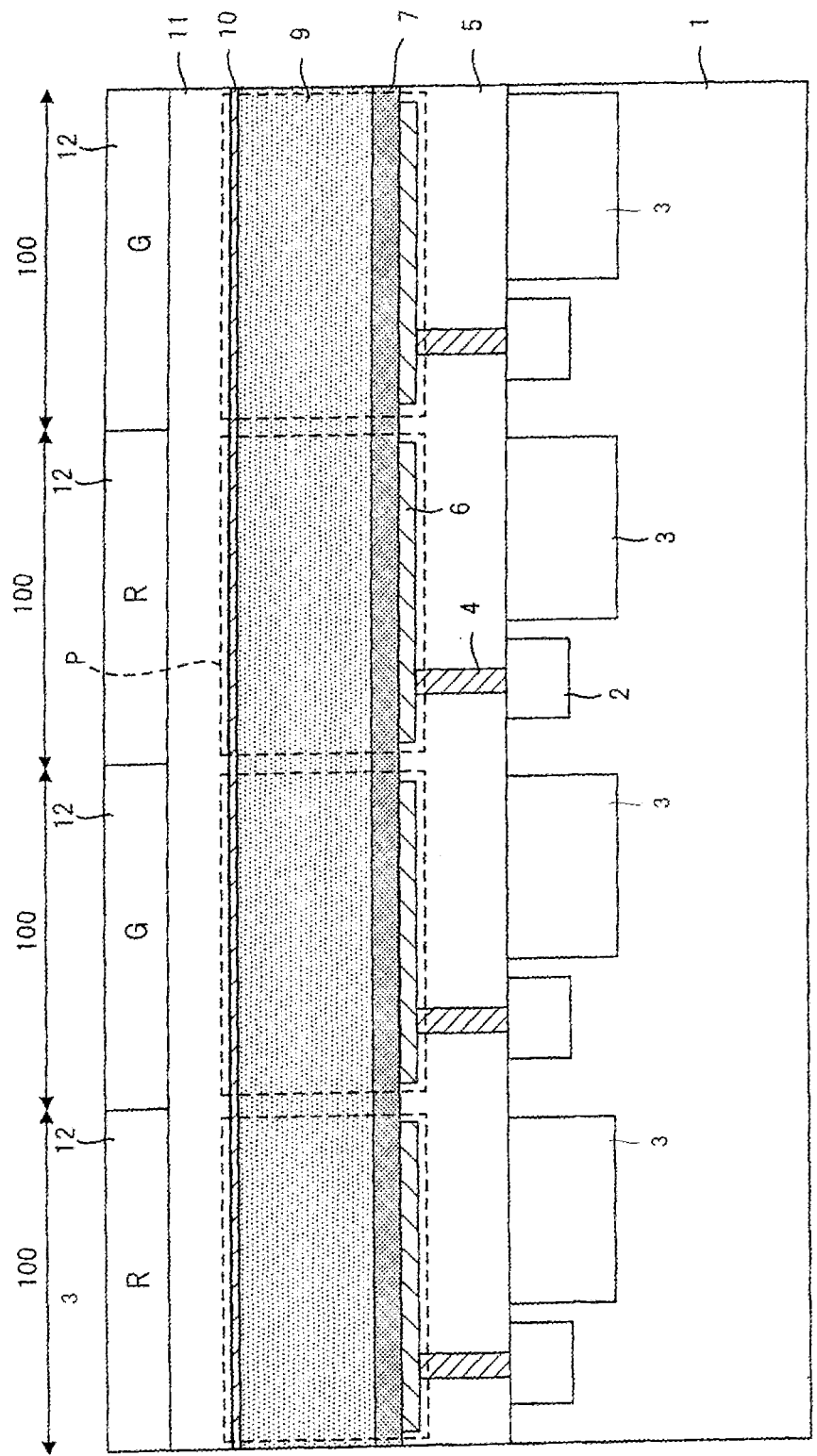
FIG. 2 is a schematic sectional view along an II-II line in the imaging device shown in FIG. 1.

FIG. 2 is a schematic sectional view along an II-II line in the imaging device shown in FIG. 1. As shown in FIG. 2, each pixel 100 includes a charge accumulating part 2, a read-out part 3, a contact part 4, an organic photoelectric conversion device P, a sealing layer 11 and a color filter 12.

The organic photoelectric conversion device P is a device which receives light to generate a charge corresponding to the amount of received light. The organic photoelectric conversion device P has a structure in which a pixel electrode 6, an electron blocking layer 7, a photoelectric conversion layer 9 and a counter electrode 10 are provided, and these are stacked in this order in an upper portion of a silicon substrate 1.

The pixel electrode 6 is separated in the every pixel 100. The electron blocking layer 7, the photoelectric conversion layer 9 and the counter electrode 10 are not separated, respectively in the every pixel 100 but are a common layer, respectively in all of the pixels 100.

The charge accumulating part 2 is one for accumulating a hole generated in the organic photoelectric conversion device P.

The read-out part 3 is one for converting the hole accumulated in the charge accumulating part 2 to a signal corresponding to a charge amount thereof and outputting the signal. For the read-out part 3, a circuit constituted of CCD (charge coupled device) and an amplifier, a MOS circuit using a MOS (metal-oxide-semiconductor) transistor, and so on are used.

The contact part 4 is one for electrically connecting the pixel electrode 6 of the organic photoelectric conversion device P to the charge accumulating part 2 and is constituted of an electrically conductive material (for example, a metal, etc.) formed on the charge accumulating part 2.

The pixel electrode 6 is an electrode for collecting a hole generated in the photoelectric conversion layer 9. The contact part 4 and the pixel electrode 6 are formed within an insulating layer 5 (for example, silicon oxide, etc.) formed on the silicon substrate 1.

Examples of a material of the pixel electrode 6 include metals, metal oxides, metal nitrides, metal borides, organic electrically conductive compound and mixtures thereof. Specific examples thereof include electrically conductive metal oxides such as tin oxide, zinc oxide, indium oxide, indium tin oxide (ITO), indium zinc oxide (IZO), indium tungsten oxide (IWO) and titanium oxide; metal nitrides such as titanium nitride (TiN); metals such as gold (Au), platinum (Pt), silver (Ag), chromium (Cr), nickel (Ni) and aluminum (Al); mixtures or stacks of these metals and electrically conductive metal oxides; organic electrically conductive materials such as polyaniline, polythiophene and polypyrrole; and stacks thereof with ITO. Any materials selected from titanium nitride, molybdenum nitride, tantalum nitride and tungsten nitride are especially preferable as the material of the pixel electrode 6.

The electron blocking layer 7 is a layer for preventing the injection of an electron from the pixel electrode 6 into the photoelectric conversion layer 9 from occurring and is constituted of a single layer or plural layers. The electron blocking layer 7 is preferably constituted of a material having not only a high electron injection barrier from the adjacent electrode but high hole transport properties.

The photoelectric conversion layer 9 is the foregoing photoelectric conversion layer and is a layer configured to include an organic photoelectric conversion material which receives light to generate charges (an electron and a hole) corresponding to the amount of received light. Since this imaging device undergoes the separation of light into its spectral components by the color filter 12, a material having sensitivity over the whole of a visible light region is used as a material of the photoelectric conversion layer 9.

The photoelectric conversion layer 9 includes an organic photoelectric conversion material, and as a result, the photoelectric conversion layer 9 is a layer of an aggregate of molecules. For that reason, a dangling bond does not substantially exist in the photoelectric conversion layer 9. Also, by forming the photoelectric conversion layer 9 as a layer obtained by thin film fabrication of an organic photoelectric conversion material as a main component, it is possible to make the dangling bond disappear completely. For example, when the photoelectric conversion layer 9 is a mixed layer of a p-type organic material and an n-type organic material, a dangling bond is not generated in the photoelectric conversion layer 9. The terms "main component" as referred to herein mean that a proportion of the organic photoelectric conversion material contained in the photoelectric conversion layer 9 is 90% or more, preferably 95% or more, and more preferably 99% or more, and it is meant that the photoelectric conversion layer 9 is substantially constituted of only an organic material.

In this way, since the photoelectric conversion layer 9 is constituted such that a dangling bond does not substantially exist, it might be considered that the electron spin number is substantially 0, but actually, such is not realized. As described previously, since it has been understood that there is a correlation between the electron spin number of the photoelectric conversion layer 9 and the dark current, what this electron spin number is made small as far as possible leads to suppression of the dark current. In this embodiment, by determining the material and forming conditions of the photoelectric conversion layer 9 such that the electron spin number of the photoelectric conversion layer at room temperature (25° C.) is not more than $1.0 \times 10^{15}/cm^3$, and theoretically 0, it becomes possible to reduce the dark current to a level on which there is no problem as an application for imaging device from the standpoint of practical use.

Since the counter electrode 10 is required to make light incident into the photoelectric conversion layer 9, the counter electrode 10 is constituted of a material (for example, ITO) that is transparent against light to which the photoelectric conversion layer 9 is sensitive. The counter electrode 10 is constituted such that a bias voltage is impressed thereto by a non-illustrated wiring. In this imaging device, since the hole is collected by the pixel electrode 6, the polarity of the bias voltage is set in such a manner that the hole moves to the pixel electrode 6, whereas the electron moves to the counter electrode 10.

Examples of a material of the counter electrode 10 include metals, metal oxides, metal nitrides, metal borides, organic electrically conductive compound and mixtures thereof. Specific examples thereof include electrically conductive metal oxides such as tin oxide, zinc oxide, indium oxide, indium tin oxide (ITO), indium zinc oxide (IZO), indium tungsten oxide (IWO) and titanium oxide; metal nitrides such as titanium nitride (TiN); metals such as gold (Au), platinum (Pt), silver (Ag), chromium (Cr), nickel (Ni) and aluminum (Al); mixtures or stacks of these metals and electrically conductive metal oxides; organic electrically conductive materials such as polyaniline, polythiophene and polypyrrole; and stacks thereof with ITO.

The counter electrode 10 may be separated in the every pixel 100. When the counter electrode 10 is separated in the every pixel 100, the respective separated counter electrodes 10 may be electrically connected to each other by wirings. Also, the positions of the pixel electrode 6 and the counter electrode 10 may be reversed to each other. At that time, it is necessary to reverse the positions of the electron blocking layer 7 and the photoelectric conversion layer 9. Also, at that time, it is necessary to form the pixel electrode 6 using a material that is sufficiently transparent against light to which the photoelectric conversion layer 9 is sensitive.

The color filter 12 is formed on the sealing layer 11 that is formed on the counter electrode 10. The color filter 12 of the R pixel 100 is a filter for allowing R light to transmit therethrough and is symbolized by "R" in FIG. 2. The color filter 12 of the G pixel 100 is a filter for allowing G light to transmit therethrough and is symbolized by "G" in FIG. 2. The color filter 12 of the B pixel 100 is a filter for allowing B light to transmit therethrough and is symbolized by "B" in FIG. 2.

The photoelectric conversion layer 9 may be a layer constituted of any organic material so far as the electron spin number at room temperature (25° C.) is not more than $1.0 \times 10^{15}/cm^3$. The constitution is preferably a constitution including a p-type organic material (p-type organic semiconductor) or an n-type organic material (n-type organic semiconductor), and more preferably a layer of a bulk hetero structure in which an n-type organic material and a p-type organic material are mixed.

It is preferable to use a fullerene or a fullerene derivative as the n-type organic material.

The fullerene as referred to herein means fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene or fullerene nanotube; and the fullerene derivative as referred to herein means a compound obtained by adding a substituent to such a fullerene.

In the invention, it is meant that when a specified portion is called a "group", the subject portion may not be substituted by itself, or may be substituted with one or more (up to the possible largest number) substituents. For example, an "alkyl group" means a substituted or unsubstituted alkyl group. Also, any substituents are useful as the substituent which can be used for the compound in the invention.

When such a substituent is defined as W, the substituent represented by W is not particularly limited, and any substituents are useful. Examples thereof include a halogen atom, an alkyl group (inclusive of a cycloalkyl group, a bicycloalkyl group and a tricycloalkyl group), an alkenyl group (inclusive of a cycloalkenyl group and a bicycloalkenyl group), an alkynyl group, an aryl group, a heterocyclic group (may also be called a hetero ring group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (inclusive of an anilino group), an ammonio group, an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulphato group (—OSO$_3$H) and other known substituents.

The fullerene derivative is preferably one represented by the following general formula (A).

General Formula (A)

In the general formula (A), $R_1$ represents a substituent. As the substituent, those exemplified above for W are useful. The substituent is preferably an alkyl group, an aryl group or a heterocyclic group, and preferred substituents and preferred specific examples thereof are those exemplified above for W. The alkyl group is more preferably an alkyl group having from 1 to 12 carbon atoms. The aryl group and the heterocyclic group are preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolidine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxanthine ring, a phenothiazine ring or a phenazine ring; more preferably a benzene ring, a naphthalene ring, an anthracene ring, a phenanthrene ring, a pyridine ring, an imidazole ring, an oxazole ring or a thiazole ring; and especially preferably a benzene ring, a naphthalene ring or a pyridine ring. Such a substituent may further have a substituent, and the subject substituent may be bonded to form a ring as far as possible, When n is 2 or more, each $R_1$ may be the same as or different from every other $R_1$. Also, plural $R_1$'s may be bonded to form a ring as far as possible.

n represents an integer of from 1 to 60, and preferably an integer of from 1 to 10.

Examples of the fullerene derivative which is preferably used are given below, but it should not be construed that the invention is limited thereto.

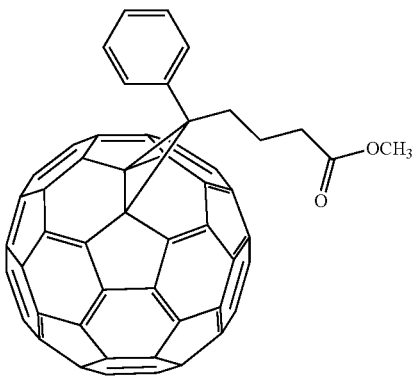

(1)

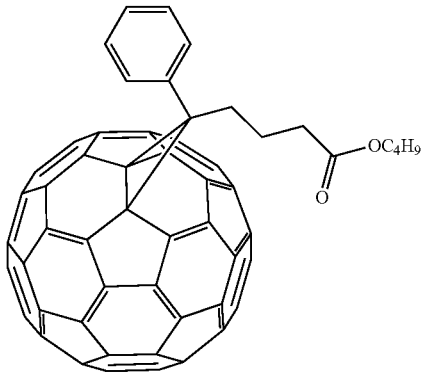

(2)

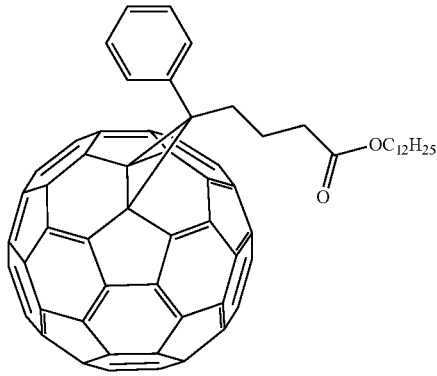

(3)

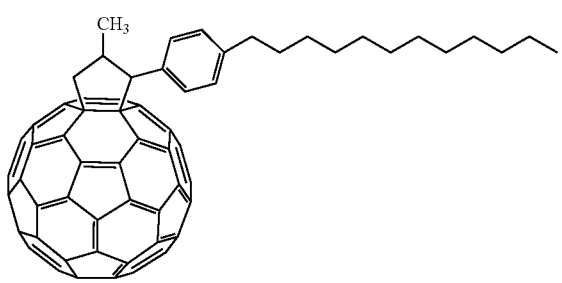

(4)

(5)

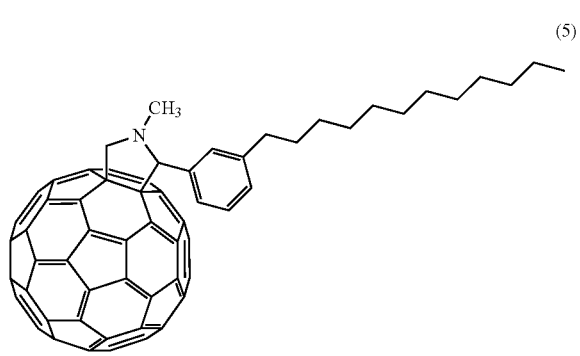

(6)

(7)

(8)

(9)

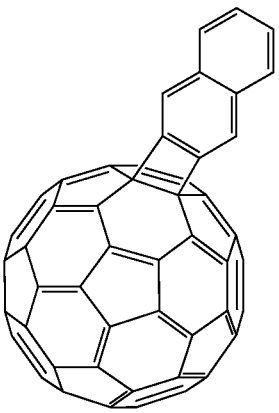

(10)

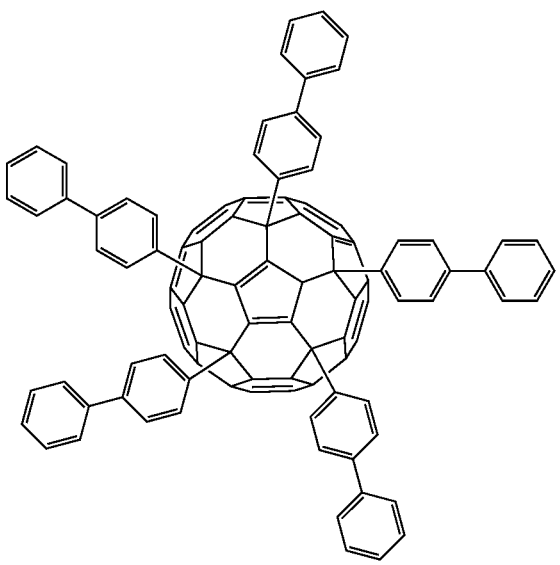

As the fullerene and fullerene derivative, compounds described in The Chemical Society of Japan Ed., *Kikan Kagaku Sosetsu* (Quarterly Review of Chemistry) No. 43 (1999), JP-A-10-167994, JP-A-11-255508, JP-A-11-255509, JP-A-2002-241323, JP-A-2003-196881 and so on can be used. The fullerene and fullerene derivative which are used in the invention can be manufactured by methods described in, for example, The Chemical Society of Japan Ed., *Kikan Kagaku Sosetsu* (Quarterly Review of Chemistry) No. 43 (1999), JP-A-10-167994, JP-A-11-255508, JP-A-11-255509, JP-A-2002-241323, JP-A-2003-196881, etc. or according to such methods.

When the photoelectric conversion layer 9 contains the fullerene or fullerene derivative, the charge generated by photoelectric conversion can be fast transported into the pixel electrode 6 or the counter electrode 10 via the fullerene molecule or fullerene derivative molecule. When the fullerene molecules or fullerene derivative molecules extend in a line to form a path of electrons, the electron transport properties are enhanced, thereby enabling the organic photoelectric conversion device to realize a high-speed response. In order to achieve this, it is preferable that the fullerene or fullerene derivative is contained in a ratio of 40% or more in the photoelectric conversion layer 9. However, when the ratio of the fullerene or fullerene derivative is too large, the amount of the p-type organic material becomes small, a junction interface becomes small, and the exciton dissociation efficiency is lowered.

In the photoelectric conversion layer 9, use of a triarylamine compound described in Japanese Patent No. 4213832 as the p-type organic material to be mixed together with the fullerene or fullerene derivative is especially preferable because it is possible to reveal a high SN ratio of the organic photoelectric conversion device. When the ratio of the fullerene or fullerene derivative within the photoelectric conversion layer 9 is too large, the ratio of the triarylamine compound becomes small, and the absorption amount of incident light is lowered. According to this, the photoelectric conversion efficiency is reduced, and therefore, a composition in which the ratio of the fullerene or fullerene derivative contained in the photoelectric conversion layer 9 is not more than 85% is preferable.

The p-type organic photoelectric conversion material of the invention is preferably a compound represented by the following general formula (B).

General Formula (B)

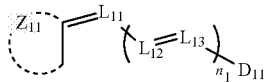

In the general formula (B), $Z_{11}$ is a ring containing at least two carbon atoms and represents a 5-membered ring, a 6-membered ring or a condensed ring containing at least one of a 5-membered ring and a 6-membered ring; each of $L_{11}$, $L_{12}$ and $L_{13}$ independently represents an unsubstituted methine group or a substituted methine group; $D_{11}$ represents an arylene group or a hetero aromatic ring; and $n_1$ represents an integer of 0 or more.

$Z_{11}$ is a ring containing at least two carbon atoms and represents a 5-membered ring, a 6-membered ring or a condensed ring containing at least one of a 5-membered ring and a 6-membered ring. As the 5-membered ring, the 6-membered ring or the condensed ring containing at least one of a 5-membered ring and a 6-membered ring, one which is generally used as an acid nucleus in merocyanine dyes is preferable, and specific examples thereof include those described below.

(a) 1,3-Dicarbonyl nucleus: such as 1,3-indanedione, 1,3-cyclohexanedione, 5,5-dimethyl-1,3-cyclohexanedione and 1,3-dioxane-4,6-dione;
(b) Pyrazolinone nucleus: such as 1-phenyl-2-pyrazolin-5-one, 3-methyl-1-phenyl-2-pyrazolin-5-one and 1-(2-benzothiazoyl)-3-methyl-2-pyrazolin-5-one;
(c) Isoxazolinone nucleus: such as 3-phenyl-2-isoxazolin-5-one and 3-methyl-2-isoxazolin-5-one;
(d) Oxyindoleu nucleu: such as a 1-alkyl-2,3-dihydro-2-oxyindole;
(e) 2,4,6-Triketohexahydropyrimidine nucleus: such as barbituric acid, 2-thiobarbituric acid and derivatives thereof (examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocycle-substituted form such as 1,3-di(2-pyridyl));
(f) 2-Thio-2,4-thiazolidinedione nucleus: such as rhodanine and derivatives thereof (examples of the derivative include a 3-alkylrhodanine such as 3-methylrhodanine, 3-ethyl-rhodanine and 3-allylrhodanine, a 3-arylrhodanine such as 3-phenylrhodanine, and a 3-heterocycle-substituted rhodanine such as 3-(2-pyridyl)rhodanine);
(g) 2-Thio-2,4-oxazolidinedione (2-thio-2,4-(3H,5H)-oxazoledione) nucleus: such as 3-ethyl-2-thio-2,4-oxazolidinedione;
(h) Thianaphthenone nucleus: such as 3(2H)-thianaphthenone-1,1-dioxide;
(i) 2-Thio-2,5-thiazolidinedione nucleus: such as 3-ethyl-2-thio-2,5-thiazolidinedione;
(j) 2,4-Thiazolidinedione nucleus: such as 2,4-thiazolidinedione, 3-ethyl-2,4-thiazolidinedione and 3-phenyl-2,4-thiazolidinedione;
(k) Thiazolin-4-one nucleus: such as 4-thiazolinone and 2-ethyl-4-thiazolinone;
(l) 2,4-Imidazolidinedione (hydantoin) nucleus: such as 2,4-imidazolidinedione and 3-ethyl-2,4-imidazolidinedione;
(m) 2-Thio-2,4-imidazolidinedione (2-thiohydantoin) nucleus: such as 2-thio-2,4-imidazolidinedione and 3-ethyl-2-thio-2,4-imidazolidinedione;
(n) 2-Imidazolin-5-one nucleus: such as 2-propylmercapto-2-imidazolin-5-one;
(o) 3,5-Pyrazolidinedione nucleus: such as 1,2-diphenyl-3,5-pyrazolidinedione and 1,2-dimethyl-3,5-pyrazolidinedione;
(p) Benzothiophen-3-one nucleus: such as benzothiophen-3-one, oxobenzothiophen-3-one and dioxobenzothiophen-3-one; and
(q) Indanone nucleus: such as 1-indanone, 3-phenyl-1-indanone, 3-methyl-1-indanone, 3,3-diphenyl-1-indanone and 3,3-dimethyl-1-indanone.

The ring formed by $Z_{11}$ is preferably a 1,3-dicarbonyl nucleus, a pyrazolinone nucleus, a 2,4,6-triketohexahydropyrimidine nucleus (inclusive of a thioketone form, for example, a barbituric acid nucleus or a 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (inclusive of a thioketone form, for example, a barbituric acid nucleus or a 2-thiobarbituric acid nucleus), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (inclusive of a thioketone form, for example, a barbituric acid nucleus or a 2-thiobarbituric acid nucleus), and especially preferably a 1,3-indanedione nucleus, a barbituric acid nucleus, a 2-thiobarbituric acid nucleus or a derivative thereof.

Each of $L_{11}$, $L_{12}$ and $L_{13}$ independently represents an unsubstituted methine group or a substituted methine group. Substituted methine groups may be bonded to each other to form a ring (for example, a 6-membered ring such as a benzene ring). Examples of the substituent of the substituted methine group include the substituent W. It is preferable that all of $L_{11}$, $L_{12}$ and $L_{13}$ are an unsubstituted methine group.

$L_{11}$ to $L_{13}$ may be connected to each other to form a ring. Preferred examples of the formed ring include a cyclohexene ring, a cyclopentene ring, a benzene ring, a naphthalene ring, a thiophene ring and a pyran ring.

$n_1$ represents an integer of 0 or more, preferably an integer of 0 or more and not more than 3, more preferably 0. When $n_1$ is increased, though an absorption wavelength region is allowed to reside on a long wavelength side, a decomposition temperature by heat becomes low. From the standpoints of having appropriate absorption in a visible region and suppressing thermal decomposition at the time of thin film fabrication by vapor deposition, $n_1$ is preferably 0.

$D_{11}$ represents an arylene group or a heteroarylene group, and preferably an arylene group. $D_{11}$ is preferably a group containing —$NR^a(R^b)$, and more preferably an arylene group on which —$NR^a(R^b)$ is substituted. Each of $R^a$ and $R^b$ independently represents a hydrogen atom or a substituent.

The arylene represented by $D_{11}$ is preferably an arylene group having from 6 to 30 carbon atoms, and more preferably an arylene group having from 6 to 18 carbon atoms. The arylene group may have the substituent W as described later, and the arylene group is preferably an arylene group having from 6 to 18 carbon atoms which may have an alkyl group having from 1 to 4 carbon atoms. Examples of the arylene group include a phenylene group, a naphthylene group, an anthracenylene group, a phenanthrenylene group, a methylphenylene group and a dimethylphenylene group, with a phenylene group or a naphthylene group being preferable.

The heteroarylene group represented by $D_{11}$ is preferably a heteroarylene group having from 3 to 30 carbon atoms, and more preferably a heteroarylene group having from 4 to 18 carbon atoms. The heteroarylene group may have the substituent W as described later, and the heteroarylene group is preferably a heteroarylene group having from 4 to 18 carbon atoms which may have an alkyl group having from 1 to 4 carbon atoms. Preferred examples of the heteroarylene structure include thiophene, furan, pyrrole, oxazole, diazole, thiazole and benzo-condensed derivatives or thieno-condensed derivatives thereof. Above all, thiophene, benzothiophene, thienothiophene, dibenzothiophene or bithienothiophene is more preferable.

As the substituent represented by each of $R^a$ and $R^b$, the substituent W as described later is exemplified. Above all, an aliphatic hydrocarbon group (preferably an optionally substituted alkyl group or alkenyl group), an aryl group (preferably an optionally substituted phenyl group) or a heterocyclic group.

The aryl groups represented by each of $R^a$ and $R^b$ is independently preferably an aryl group having from 6 to 30 carbon atoms, and more preferably an aryl group having from 6 to 18 carbon atoms. The aryl group may have a substituent and is preferably an aryl group having from 6 to 18 carbon atoms which may have an alkyl group having from 1 to 4 carbon atoms or an aryl group having from 6 to 18 carbon atoms. Examples thereof include a phenyl group, a naphthyl group, an anthracenyl group, a pyrenyl group, a phenanthrenyl group, a methylphenyl group, a dimethylphenyl group and a biphenyl group, with a phenyl group, a naphthyl group or an anthracenyl group being preferable.

The heterocyclic group represented by each of $R^a$ and $R^b$ is independently preferably a heterocyclic group having from 3 to 30 carbon atoms, and more preferably a heterocyclic group having from 3 to 18 carbon atoms. The heterocyclic group may have a substituent and is preferably a heterocyclic group having from 3 to 18 carbon atoms which may have an alkyl group having from 1 to 4 carbon atoms or an aryl group having from 6 to 18 carbon atoms. Also, the heterocyclic group represented by each of $R^a$ and $R^b$ is preferably a condensed ring structure. The condensed ring structure is preferably a condensed ring structure of a combination of rings selected among a furan ring, a thiophene ring, a selenophene ring, a silole ring, a pyridine ring, a pyrazine ring, a pyrimidine ring, an oxazole ring, a thiazole ring, a triazole ring, an oxadiazole ring and a thiadiazole ring (each ring may be the same as every other ring). Above all, a quinoline ring, an isoquinoline ring, a benzothiophene ring, a dibenzothiophene ring, a thienothiophene ring, a bithienobenzene ring or a bithienothiophene ring is more preferable.

The arylene group or the aryl group represented by each of $D_{11}$, $R^a$ and $R^b$ is preferably a condensed ring structure, more preferably a benzene ring-containing condensed ring structure, still more preferably a naphthalene ring, an anthracene ring, a pyrene ring or a phenanthrene ring, and especially preferably a naphthalene ring or an anthracene ring.

Examples of the substituent W include a halogen atom, an alkyl group (inclusive of a cycloalkyl group, a bicycloalkyl group and a tricycloalkyl group), an alkenyl group (inclusive of a cycloalkenyl group and a bicycloalkenyl group), an alkynyl group, an aryl group, a heterocyclic group (may also be called a hetero ring group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (inclusive of an anilino group), an ammonio group, an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulphato group (—$OSO_3H$) and other known substituents.

When the substituents represented by each of $R^a$ and $R^b$ represents an aliphatic hydrocarbon group (preferably an alkyl group or an alkenyl group), such a substituent may be bonded to a hydrogen atom of the aromatic ring (preferably a benzene ring) structure of the aryl group on which —$NR^a(R^b)$ is substituted, or a substituent to form a ring (preferably a 6-membered ring).

In each of $R^a$ and $R^b$, the substituents may be bonded to each other to form a ring (preferably a 5-membered or 6-membered ring, and more preferably a 6-membered ring); and also, each of $R^a$ and $R^b$ may be bonded to the substituent in L (represents any one of $L_{11}$, $L_{12}$ and $L_{13}$) to form a ring (preferably a 5-membered or 6-membered ring, and more preferably a 6-membered ring).

The compound represented by the general formula (B) is a compound described in JP-A-2000-297068, and compounds which are not described in this patent document can also be manufactured according to a synthesis method described therein.

The compound represented by the general formula (B) is preferably a compound represented by the following general formula (C).

General Formula (C)

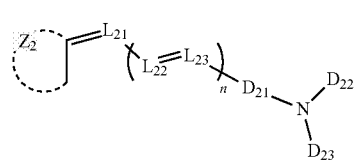

In the general formula (C), $Z_2$, $L_{21}$, $L_{22}$, $L_{23}$ and n are synonymous with $Z_{11}$, $L_{11}$, $L_{12}$, $L_{13}$ and $n_1$ in the general formula (B), respectively, and preferred examples thereof are also the same. $D_{21}$ represents a substituted or unsubstituted arylene group. Each of $D_{22}$ and $D_{23}$ independently represents a substituted or unsubstituted aryl group or a substituted or unsubstituted heterocyclic group.

Each of $D_{21}$, $D_{22}$ and $D_{23}$ is independently preferably a condensed ring aromatic group. The condensed aromatic ring group is preferably a condensed ring structure of a combination of rings selected among a benzene ring, a furan ring, a thiophene ring, a selenophene ring, a silole ring, a pyridine ring, a pyrazine ring, a pyrimidine ring, an oxazole ring, a thiazole ring, a triazole ring, an oxadiazole ring and a thiadiazole ring (each ring may be the same as every other ring). Above all, a naphthalene ring, an anthracene ring, a pyrene ring, a phenanthrene ring, a quinoline ring, an isoquinoline ring, a benzothiophene ring, a dibenzothiophene ring, a thienothiophene ring, a bithienobenzene ring or a bithienothiophene ring is more preferable.

The arylene group or the aryl group represented by each of $D_{21}$, $D_{22}$ and $D_{23}$ is preferably a condensed ring structure, more preferably a benzene ring-containing condensed ring structure, still more preferably a phenyl ring, a naphthalene ring, an anthracene ring, a pyrene ring or a phenanthrene ring, and especially preferably a naphthalene ring or an anthracene ring.

The heterocyclic group represented by each of $D_{22}$ and $D_{23}$ is preferably a condensed ring structure. The condensed ring structure is preferably a condensed ring structure of a combination of rings selected among a furan ring, a thiophene ring, a selenophene ring, a silole ring, a pyridine ring, a pyrazine ring, a pyrimidine ring, an oxazole ring, a thiazole ring, a triazole ring, an oxadiazole ring and a thiadiazole ring (each ring may be the same as every other ring). Above all, a quinoline ring, an isoquinoline ring, a benzothiophene ring, a dibenzothiophene ring, a thienothiophene ring, a bithienobenzene ring or a bithienothiophene ring is more preferable.

Preferred specific examples of the p-type photoelectric conversion material represented by the general formula (B) are hereunder given by referring to the following general formula (D), but it should not be construed that the invention is limited thereto.

General Formula (D)

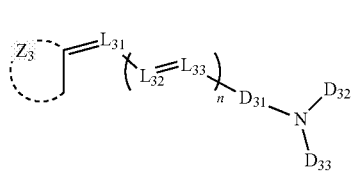

In the general formula (D), $Z_3$ represents any one of A-1 to A-12 in the following Table 1; $L_{31}$ represents a methylene group; n represents 0; $D_{31}$ represents any one of B-1 to B-9; and each of $D_{32}$ and $D_{33}$ represents any one of C-1 to C-15. It is preferred that $D_{31}$ and $D_{32}$, $D_{31}$ and $D_{33}$, or $D_{32}$ and $D_{33}$ are connected to each other so as to form a condensed ring structure. Examples of such a structure are shown in D1 to D4 depicted in Table 1. The case where $D_{31}$ and $D_{32}$, $D_{31}$ and $D_{33}$, or $D_{32}$ or $D_{33}$ are connected to each other to form a condensed ring structure is preferable, and specific examples of that case are expressed by D-1 to D-4 in the following Table 1.

TABLE 1

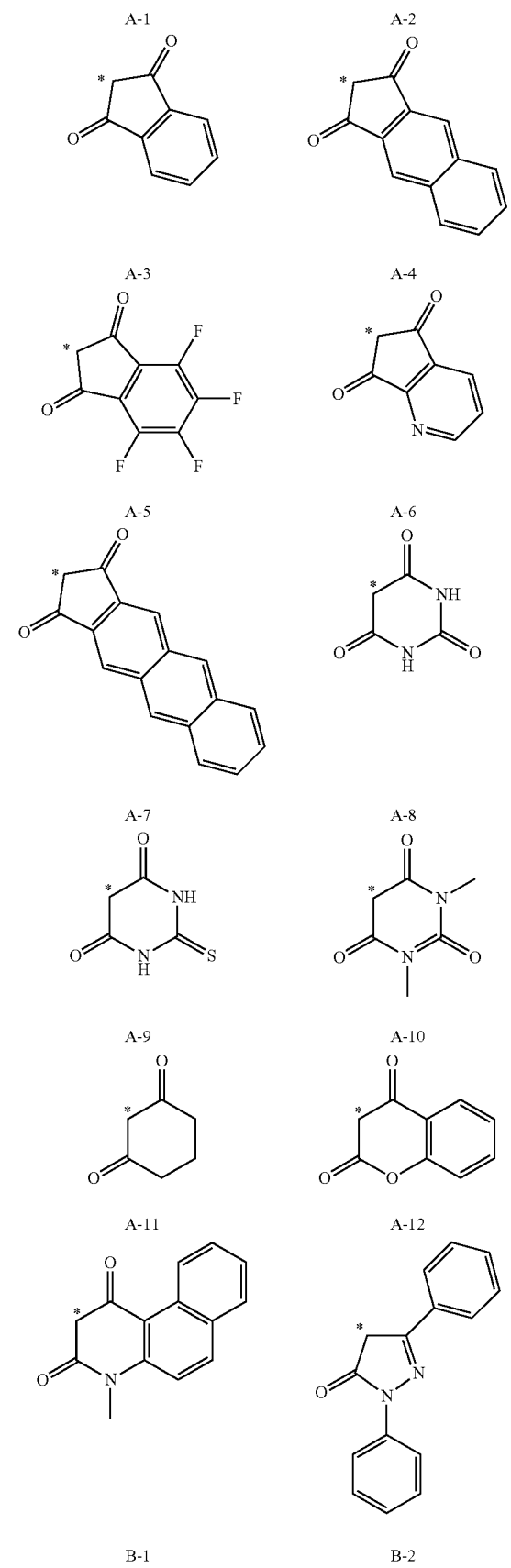

TABLE 1-continued

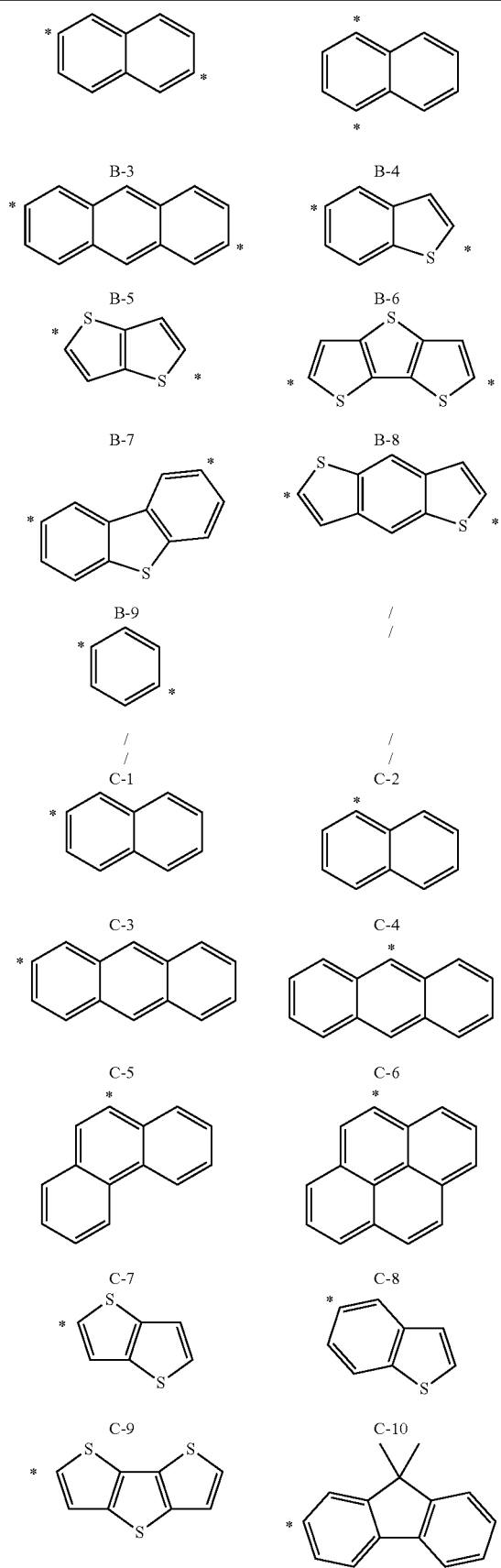

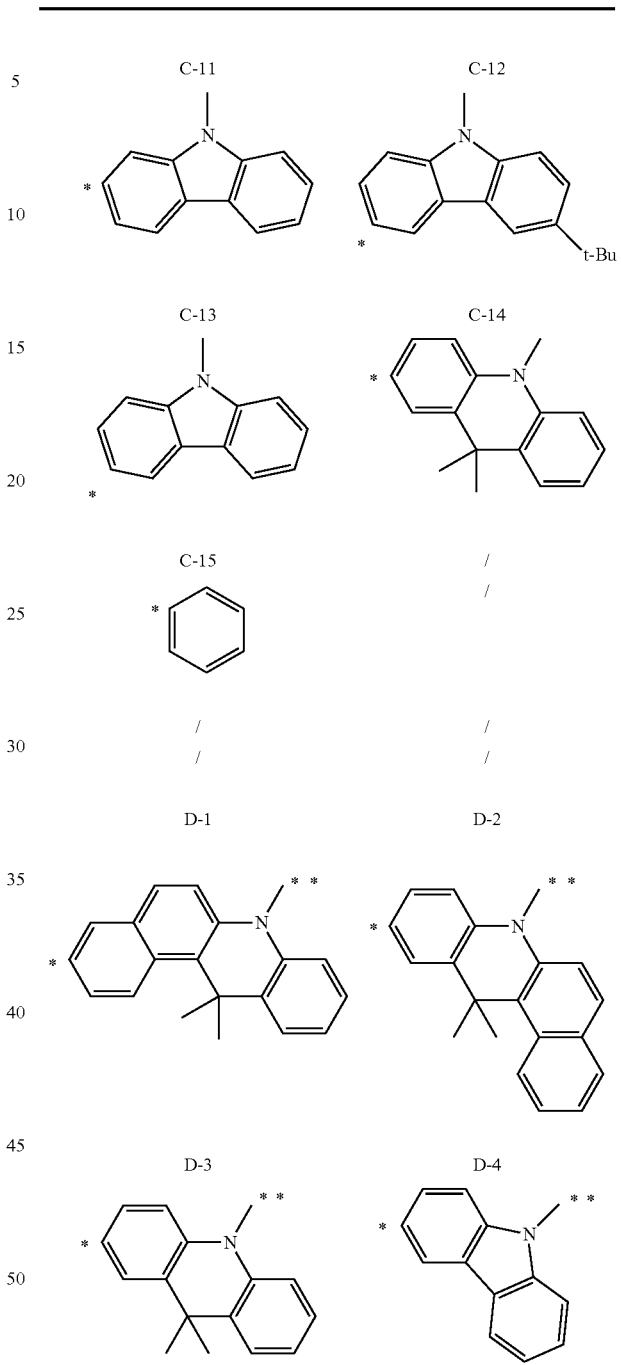

("*" in the table represents a bonding position)

In D-1 to D-4, when $D_{31}$ and $D_{32}$, or $D_{31}$ and $D_{33}$ are connected to each other to form a ring, "**" represents a bonding potion of $D_{32}$ or $D_{33}$ (either one not connected to $D_{31}$); and "*" represents a bonding position to $L_{31}$. When $D_{32}$ and $D_{33}$ are connected to each other to form a ring, then "**" represents a bonding position to $D_{31}$ (in that case, "*" does not represent a bonding position).

Also, a compound represented by the following general formula (I) is preferable as the p-type organic photoelectric conversion material of the invention.

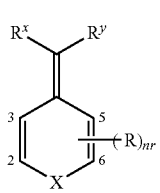

General Formula (I)

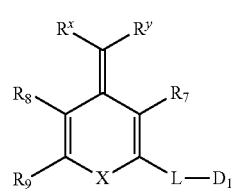

General Formula (Ia)

In the general formula (I), X represents O, S or N—$R_{10}$. $R_{10}$ represents a hydrogen atom or a substituent. Each of $R^x$ and $R^y$ independently represents a hydrogen atom or a substituent, and at least one of them represents an electron-withdrawing group. Also, $R^x$ and $R^y$ may be connected to each other to form a ring. Each R represents a bond, a hydrogen atom or a substituent, and at least of R's represents a bond (—). nr represents an integer of from 1 to 4. When nr is 2 or more, each R may be the same as or different from every other R. R's at the 2-position and 3-position, and R's at the 5-position and 6-position, may be connected to each other to form a ring.

X represents an oxygen atom, a sulfur atom or N—$R_{10}$, and $R_{10}$ represents a hydrogen atom or a substituent. X is preferably an oxygen atom or N—$R_{10}$, and more preferably an oxygen atom.

As the substituent represented by $R_{10}$, those exemplified below for the substituent W are applicable. Also, as the substituent represented by $R^x$ and $R^y$, those exemplified below for the substituent W are applicable. At least one of $R^x$ and $R^y$ is an electron-withdrawing group. A total sum of $Sp^2$ carbons contained in $R^x$ and $R^y$ is preferably 3 or more.

Examples of the substituent W include a halogen atom, an alkyl group (inclusive of a cycloalkyl group, a bicycloalkyl group and a tricycloalkyl group), an alkenyl group (inclusive of a cycloalkenyl group and a bicycloalkenyl group), an alkynyl group, an aryl group, a heterocyclic group (may also be called a hetero ring group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (inclusive of an anilino group), an ammonio group, an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulphato group (—$OSO_3H$) and other known substituents.

The compound represented by the foregoing general formula (I) is preferably a compound represented by the following general formula (Ia).

In the general formula (Ia), X, $R^x$ and $R^y$ are synonymous with X, $R^x$ and $R^y$ in the general formula (I), respectively, and preferred examples thereof are also the same. Each of $R_7$ to $R_9$ independently represents hydrogen or a substituent. $R_8$ and $R_9$ may be connected to each other to form a ring. L represents a connecting group constituted of a conjugated bond. $D_1$ represents an atomic group.

Each of $R_7$ to $R_9$ independently represents hydrogen or a substituent. As the substituent represented by each of $R_7$ to $R_9$, for example, those exemplified above for the substituent W are applicable.

$R_7$ is preferably a hydrogen atom, an alkyl group, an aryl group, a halogen atom or a cyano group, more preferably a hydrogen atom or an alkyl group, and still more preferably a hydrogen atom.

$R_8$ is preferably a hydrogen atom, an alkyl group, an aryl group, a heteroaryl group or a group obtained upon being connected to $R_9$ to form a ring, more preferably a hydrogen atom or an alkyl group, and still more preferably a hydrogen atom.

$R_9$ is preferably a hydrogen atom, an alkyl group, an alkenyl group, an aryl group, a heteroaryl group or a group obtained upon being connected to $R_8$ to form a ring, more preferably an alkyl group (preferably an alkyl group having 2 or more carbon atoms and not more than 20 carbon atoms, more preferably a branched or cyclic alkyl group having 3 or more carbon atoms and not more than 20 carbon atoms, still more preferably a quaternary carbon-containing branched or cyclic alkyl group having 4 or more carbon atoms and not more than 12 carbon atoms, and especially preferably a tert-butyl group), an alkenyl group (preferably an alkenyl group having 2 or more carbon atoms and not more than 30 carbon atoms, more preferably an alkenyl group having 3 or more carbon atoms and not more than 25 carbon atoms, and still more preferably an alkenyl group having 4 or more carbon atoms and not more than 25 carbon atoms), an aryl group (preferably an aryl group having a substituent at the o-position thereof, more preferably an alkyl-substituted phenyl group having a substituent at the o-position thereof and having 7 or more carbon atoms and not more than 30 carbon atoms, still more preferably a 2,6-dimethyl-substituted phenyl group, and especially preferably a 2,4,6-trimethylphenyl group), especially preferably a tert-butyl group or a 2,4,6-trimethylphenyl group, and most preferably a tert-butyl group. Also, $R_9$ may be -L-$D_1$.

X represents an oxygen atom, a sulfur atom or N—$R_{10}$, and $R_{10}$ represents a hydrogen atom or a substituent. X is preferably an oxygen atom or N—$R_{10}$, and more preferably an oxygen atom.

The substituent represented by $R_{10}$ is preferably an alkyl group, an alkenyl group, an alkynyl group, an aryl group, an acyl group, an alkoxycarbonyl group, an aryloxycarbonyl group, a sulfamoyl group, a carbamoyl group, a sulfonyl group, a sulfinyl group or a heterocyclic group, more preferably an alkyl group, an alkenyl group, an alkynyl group, an aryl group or a heterocyclic group, still more preferably an alkyl group, an aryl group or an aromatic heterocyclic group, and yet still more preferably an alkyl group or an aryl group. The substituent represented by $R_{10}$ may further be substituted. Also, when two or more substituents are present, each substituent may be the same as or different from every other substituent. Also, if possible, the substituents may be connected to each other to form a ring.

L represents a conjugated bonding connecting group. The connecting group represented by L is preferably a conjugated bonding connecting group formed by C, N, O, S, Se, Te, Si, Ge or the like, more preferably alkenylene, alkynylene, arylene, a divalent aromatic hetero ring (preferably an aromatic hetero ring formed by an azine, azole, thiophene or furan ring), azo, imine or a group constituted of a combination thereof with N, still more preferably alkenylene, arylene, a divalent aromatic hetero ring or a group constituted of a combination thereof with N, and especially preferably a group constituted of a combination of alkenylene and arylene having from 6 to 30 carbon atoms (more preferably having from 6 to 20 carbon atoms, and especially preferably having from 6 to 12 carbon atoms).

Specific examples of the connecting group represented by L are given below.

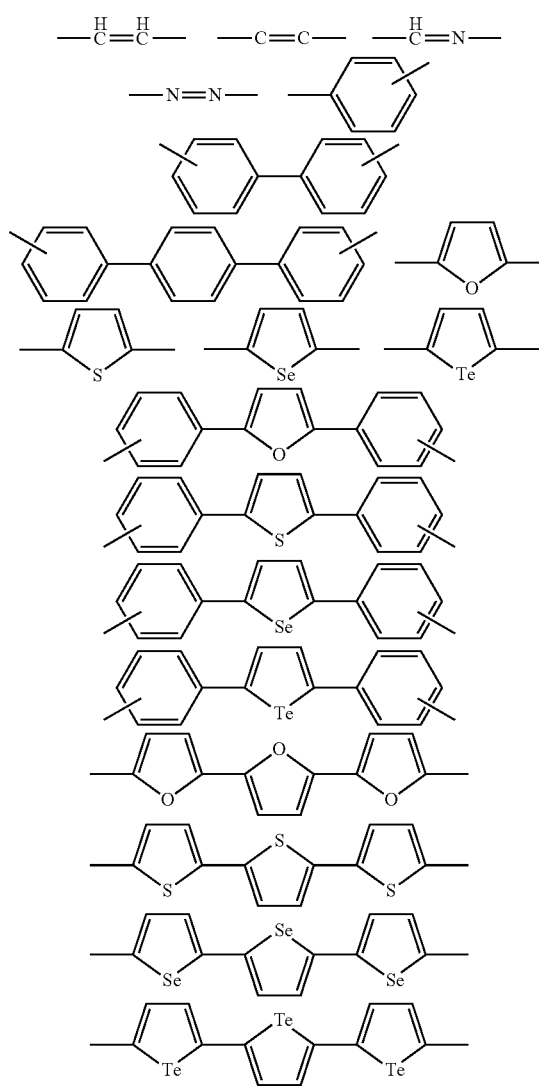

-continued

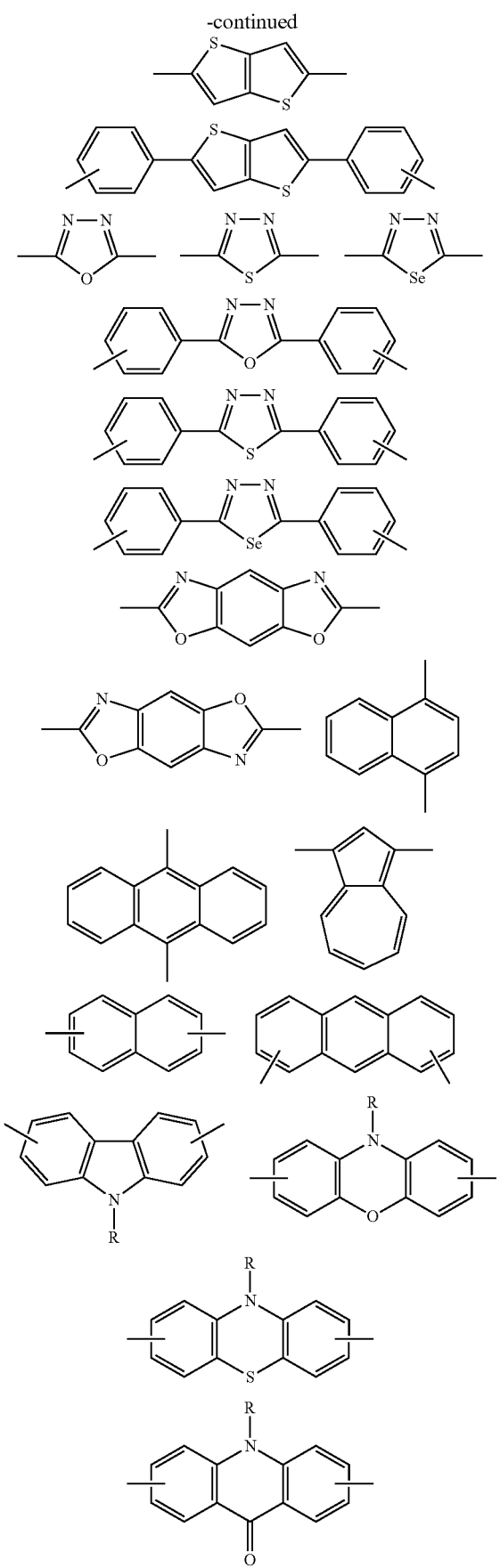

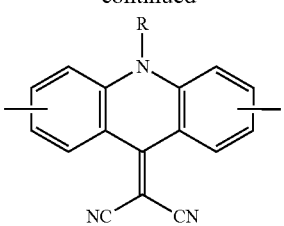
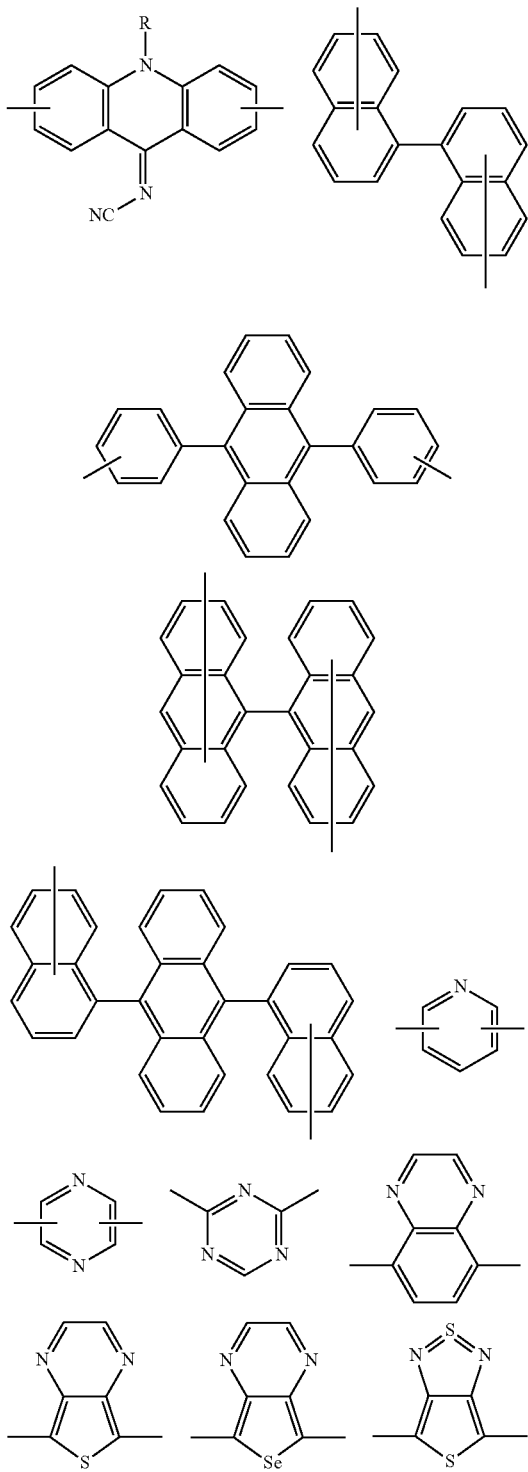
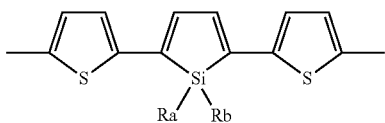

R represents a hydrogen atom, an aliphatic hydrocarbon group, an aryl group or a heterocyclic group.

Each of Ra and Rb represents an aliphatic hydrocarbon group, an aryl group or a heterocyclic group.

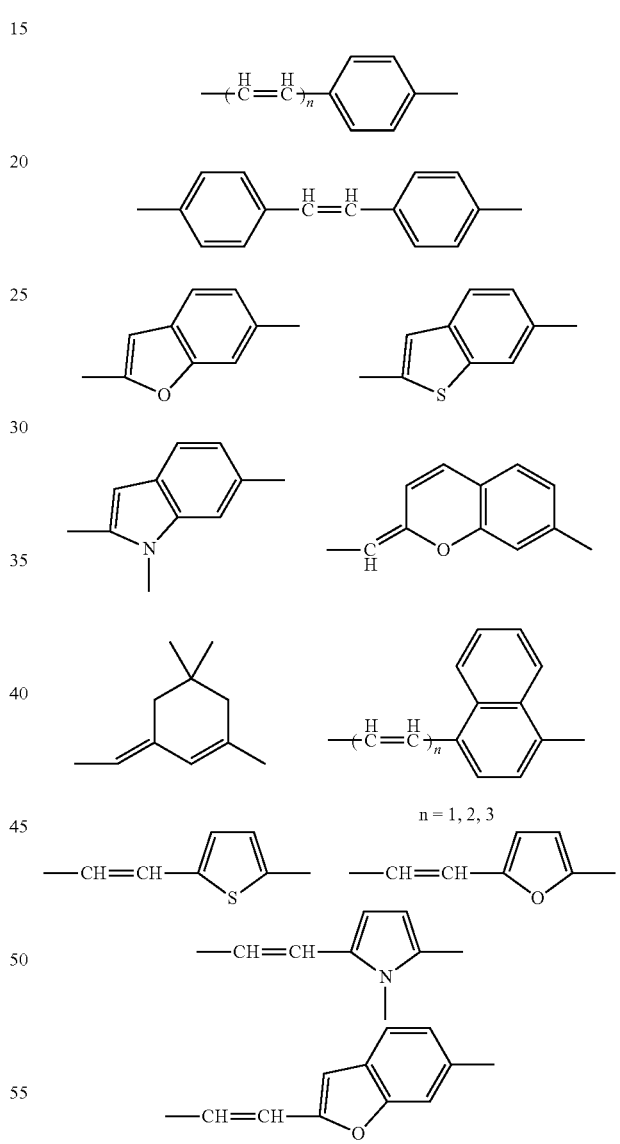

$D_1$ represents an atomic group. $D_1$ is preferably a group containing $-NR^a(R^b)$, and more preferably a divalent arylene group having $-NR^a(R^b)$ bonded thereto. Each of $R^a$ and $R^b$ independently represents a hydrogen atom or a substituent, and $R^a$, $R^b$ and L may form a ring together. In $R^a$ and $R^b$, the substituents may be bonded to each other to form a ring (preferably a 5-membered or 6-membered ring, and more preferably a 6-membered ring); and also, each of $R^a$ and $R^b$ may be bonded to the substituent in L to form a ring (preferably a 5-membered or 6-membered ring, and more preferably a 6-membered ring). Examples of the substituent represented by each of $R^a$ and $R^b$ include those exemplified above for the substituent W, and the substituent represented by each of $R^a$ and $R^b$ is preferably an aliphatic hydrocarbon group, an aryl group or a heterocyclic group.

$D_1$ is preferably a divalent arylene group (preferably a phenylene group) having an amino group bonded at the para-position thereof. The amino group may be substituted, and furthermore, the substituent of the amino group may be bonded to the substituent of the aryl group (preferably a benzene ring of a phenyl group) in the arylene group. Examples of the substituent of the amino group include those exemplified above for the substituent W, and the substituent of the amino group is preferably an aliphatic hydrocarbon group, an aryl group or a heterocyclic group.

When each of $R^a$ and $R^b$ is an aliphatic hydrocarbon group, an aryl group or a heterocyclic group, its substituent is preferably an alkyl group, an alkenyl group, an aryl group, an alkoxy group, an aryloxy group, an acyl group, an alkoxycarbonyl group, an aryloxycarbonyl group, an acylamino group, a sulfonylamino group, a sulfonyl group, a silyl group or an aromatic heterocyclic group, more preferably an alkyl group, an alkenyl group, an aryl group, an alkoxy group, an aryloxy group, a silyl group or an aromatic heterocyclic group, and still more preferably an alkyl group, an aryl group, an alkoxy group, an aryloxy group, a silyl group or an aromatic heterocyclic group. Specific examples thereof include those exemplified above for the substituent W.

Each of $R^a$ and $R^b$ is preferably an alkyl group, an aryl group or an aromatic heterocyclic group. In particular, each of $R^a$ and $R^b$ is preferably an alkyl group, an alkylene group capable of forming a ring upon being connected to L or an aryl group, more preferably an alkyl group having from 1 to 8 carbon atoms, an alkylene group capable of forming a 5-membered or 6-membered ring upon being connected to L or a substituted or unsubstituted phenyl group, and especially preferably a substituted or unsubstituted phenyl group.

The compound represented by the foregoing general formula (Ia) is preferably a compound represented by the following general formula (Ib).

General Formula (Ib)

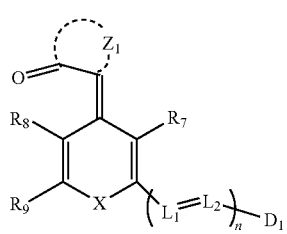

In the general formula (Ib), X, $R_7$ to $R_9$ and $D_1$ are synonymous with X, $R_7$ to $R_9$ and $D_1$ in the general formula (Ia), respectively. Each of $L_1$ and $L_2$ independently represents a methine group or a substituted methine group. $Z_1$ represents an atomic group necessary for forming a 5-membered or 6-membered ring. n represents an integer of 1 or more. n is preferably an integer of from 1 to 3.

The compound represented by the foregoing general formula (Ib) is preferably a compound represented by the following general formula (Ic).

General Formula (Ic)

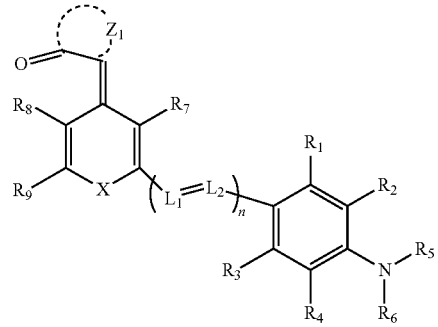

In the general formula (Ic), X, $R_7$ to $R_9$, $L_1$, $L_2$, $Z_1$ and n are synonymous with X, $R_7$ to $R_9$, $L_1$, $L_2$, $Z_1$ and n in the general formula (Ib), respectively. Each of $R_1$ to $R_6$ independently represents hydrogen or a substituent. $R_1$ and $R_2$, $R_3$ and $R_4$, $R_2$ and $R_5$, $R_4$ and $R_6$, or $R_5$ and $R_6$ may be connected to each other to form a ring.

The compound represented by the foregoing general formula (Ia) is preferably a compound represented by the following general formula (Id).

General Formula (Id)

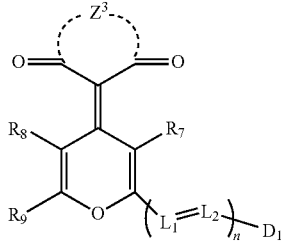

In the general formula (Id), $R_7$ to $R_9$, $L_1$, $L_2$, $D_1$ and n are synonymous with $R_7$ to $R_9$, $L_1$, $L_2$, $D_1$ and n in the general formula (Ib), respectively. $Z_3$ represents an atomic group necessary for forming a 5-membered or 6-membered ring.

The compound represented by the foregoing general formula (Ia) is preferably a compound represented by the following general formula (Ie).

General Formula (Ie)

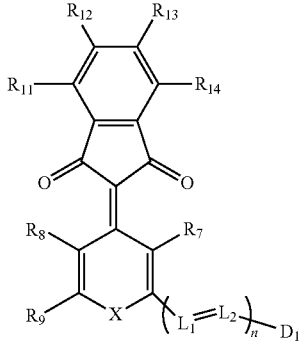

In the general formula (Ie), X, $R_7$ to $R_9$, $L_1$, $L_2$, n and $D_1$ are synonymous with X, $R_7$ to $R_9$, $L_1$, $L_2$, n and $D_1$ in the general formula (Ib), respectively. Each of $R_{11}$ to $R_{14}$ independently represents a hydrogen atom or a substituent.

The compound represented by the foregoing general formula (Ie) is preferably a compound represented by the following general formula (If).

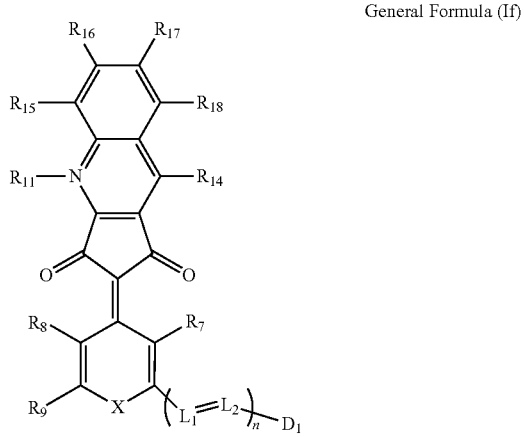

General Formula (If)

In the general formula (If), X, $R_7$ to $R_9$, $R_{11}$, $R_{14}$, $L_1$, $L_2$, n and $D_1$ are synonymous with X, $R_7$ to $R_9$, $R_{11}$, $R_{14}$, $L_1$, $L_2$, n and $D_1$ in the general formula (Ie), respectively. Each of $R_{15}$ to $R_{18}$ independently represents a hydrogen atom or a substituent.

It is preferable that all of $R_{11}$ and $R_{14}$ in the foregoing general formula (Ie) are a hydrogen atom. It is preferable that all of $R_{11}$ and $R_{14}$ to $R_{18}$ in the foregoing general formula (If) are a hydrogen atom. It is preferable that $D_1$ is represented by the following general formula (Ig).

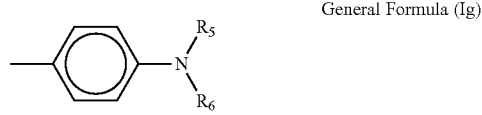

General Formula (Ig)

In the general formula (Ig), each of $R_5$ and $R_6$ independently represents hydrogen or a substituent. $R_5$ and $R_6$ may be connected to each other to form a ring. It is especially preferable that both of $R_5$ and $R_6$ are an unsubstituted or substituted phenyl group.

The compound represented by the general formula (I), especially a 4H pyran based compound, which is used in the invention, is described.

In the general formula (I), X represents O, S or N—$R_{10}$. Each of $R^x$ and $R^y$ independently represents a hydrogen atom or a substituent, and at least one of them represents an electron-withdrawing group. Also, $R^x$ and $R^y$ may be connected to each other to form a ring. However, both of $R^x$ and $R^y$ do not represent a cyano group at the same time. Each of $R_7$ to $R_{10}$ independently represents hydrogen or a substituent. $R^8$ and $R_9$ may be connected to each other to form a ring. L represents a connecting group constituted of a conjugated bond. $D_1$ represents an atomic group.

Each of $R^x$ and $R^y$ independently represents a hydrogen atom or a substituent, and at least one of them represents an electron-withdrawing group. Also, $R^x$ and $R^y$ may be connected to each other to form a ring. A total sum of $Sp^2$ carbons contained in $R^x$ and $R^y$ is preferably 3 or more.

As the substituent represented by each of $R^x$ and $R^y$, those exemplified above for the substituent W are applicable. The substituent represented by each of $R^x$ and $R^y$ is preferably an alkyl group, an alkenyl group, an aryl group, an alkoxy group, anaryloxy group, a carbonyl group, a thiocarbonyl group, an oxycarbonyl group, an acylamino group, a carbamoyl group, a sulfonylamino group, a sulfamoyl group, a sulfonyl group, a sulfinyl group, a phosphoryl group, an imino group, a halogen atom, a silyl group or an aromatic heterocyclic group, more preferably an electron-withdrawing group having a Hammett's σp value (for example, the definition and values of sigma para values are described in Chem. Rev. 1991, 165 to 195), still more preferably an aryl group, an aromatic heterocyclic group, a carbonyl group, a thiocarbonyl group, an oxycarbonyl group, a carbamoyl group, a sulfamoyl group, a sulfonyl group, an imino group, a halogen group or an electron-withdrawing ring formed upon connection of $R^x$ and $R^y$ to each other, especially preferably an aromatic heterocyclic group, a carbonyl group, an imino group or an electron-withdrawing ring formed upon connection of $R^x$ and $R^y$ to each other, and most preferably an electron-withdrawing ring formed upon connection of $R^x$ and $R^y$ to each other.

The compound represented by the general formula (Ib) is a compound obtained when $R^x$ and $R^y$ in the general formula (Ia) are connected to each other to form a ring. $Z_1$ in each of the general formulae (Ib) and (Ic) represents an atomic group necessary for forming a 5-membered or 6-membered ring. As the ring to be formed, one which is generally used as an acid nucleus in merocyanine dyes is preferable, and specific examples thereof include the same nuclei as those exemplified above for $Z_{11}$ in the foregoing general formula (B).

The ring formed by $Z_1$ is preferably a 1,3-dicarbonyl nucleus, a pyrazolinone nucleus, a 2,4,6-triketohexahydropyrimidine nucleus (inclusive of a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (inclusive of a thioketone form), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (inclusive of a thioketone form), and especially preferably a 1,3-indanedione nucleus.

Each of $L_1$ and $L_2$ independently represents an unsubstituted methine group or a substituted methine group. Examples of the substituent of the substituted methine group include those exemplified above for the substituent W. It is preferable that both of $L_1$ and $L_2$ are an unsubstituted methine group. n represents an integer of 1 or more. n is preferably 1.

The compound represented by the general formula (Ib) is more preferably the compound represented by the general formula (Ic). In the general formula (Ic), X, $R_7$ to $R_9$, $L_1$, $L_2$, $Z_1$ and n are synonymous with X, $R_7$ to $R_9$, $L_1$, $L_2$, $Z_1$ and n in the general formula (Ib), respectively, and preferred examples thereof are also the same.

Each of $R_1$ to $R_6$ independently represents hydrogen or a substituent. Preferred examples of the substituent include an aliphatic hydrocarbon group (preferably an alkyl group or an alkenyl group) and an alkoxy group.

$R_1$ and $R_2$, $R_3$ and $R_4$, $R_2$ and $R_5$, $R_4$ and $R_6$, or $R_5$ and $R_6$ may be connected to each other to form a ring. It is preferable that $R_2$ and $R_5$ are connected to each other to form a 6-membered ring.

The compound represented by the general formula (Ib) is still more preferably the compound represented by the general formula (Id). In the general formula (Id), $R_7$ to $R_9$, $L_1$, $L_2$, $D_1$ and n are synonymous with $R_7$ to $R_9$, $L_1$, $L_2$, $D_1$ and n in the general formula (Ib), respectively, and preferred examples thereof are also the same.

$Z_3$ represents an atomic group necessary for forming a 5-membered or 6-membered ring. The ring formed by $Z_3$ is, for example, a ring having a 1,3-dicarbonyl structure therein among the rings formed by $Z_1$ in the general formula (Ib). Examples thereof include 1,3-cyclopentanedione, 1,3-cyclohexanedione, 1,3-indanedione, 3,5-pyrazolidinedione and 2,4,6-triketohexahydropyrimidine nuclei. Above all, 1,3-indanedione, 3,5-pyrazolidinedione, barbituric acid, 2-thiobarbituric acid or a derivative thereof is preferable; 1,3-indandione or a 1,2-diaryl-3,5-pyrazolidinedione is more preferable; 1,3-indandione or 1,2-diphenyl-3,5-pyrazolidinedione is still more preferable; and 1,3-indandione is especially preferable. The ring formed by $Z_3$ may have a substituent, and as the substituent, those exemplified above for the substituent W are applicable.

The compound represented by the general formula (Ib) is still more preferably the compound represented by the general formula (Ie). In the general formula (Ie), X, $R_7$ to $R_9$, $L_1$, $L_2$, n and $D_1$ are synonymous with X, $R_7$ to $R_9$, $L_1$, $L_2$, n and $D_1$ in the general formula (Ib), respectively, and preferred examples thereof are also the same.

Each of $R_{11}$ to $R_{14}$ independently represents a hydrogen atom or a substituent. As the substituent, those exemplified above for the substituent W are applicable. It is preferable that all of $R_{11}$ to $R_{14}$ are a hydrogen atom.

The compound represented by the general formula (Ib) is still more preferably the compound represented by the general formula (If). In the general formula (1f), X, $R_7$ to $R_9$, $R_{11}$, $R_{14}$, $L_1$, $L_2$, n and $D_1$ are synonymous with X, $R_7$ to $R_9$, $R_{11}$, $R_{14}$, $L_1$, $L_2$, n an $D_1$ in the general formula (Ie), respectively, and preferred examples thereof are also the same.

Each of $R_{15}$ to $R_{18}$ independently represents a hydrogen atom or a substituent. As the substituent, those exemplified above for the substituent W are applicable. It is preferable that all of $R_{15}$ to $R_{18}$ are a hydrogen atom.

In the general formula (Ig), the substituent represented by each of $R_5$ and $R_6$ is synonymous with that represented by each of $R^a$ and $R^b$, and preferred examples thereof are also the same.

Specific examples of the compound represented by the general formula (I) are given below, but it should not be construed that the invention is limited thereto.

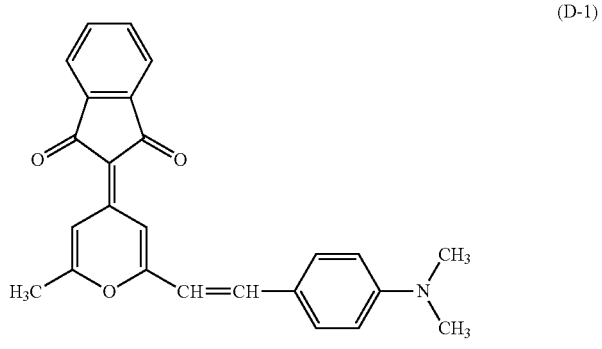

(D-1)

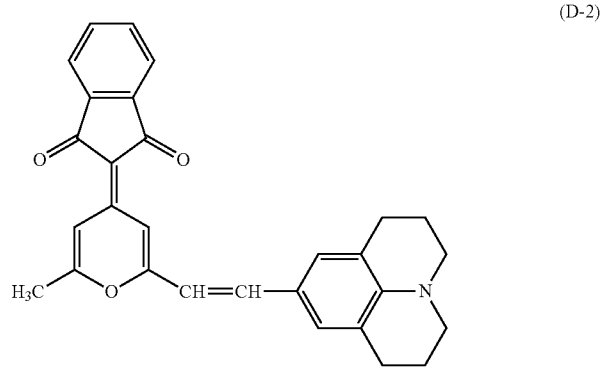

(D-2)

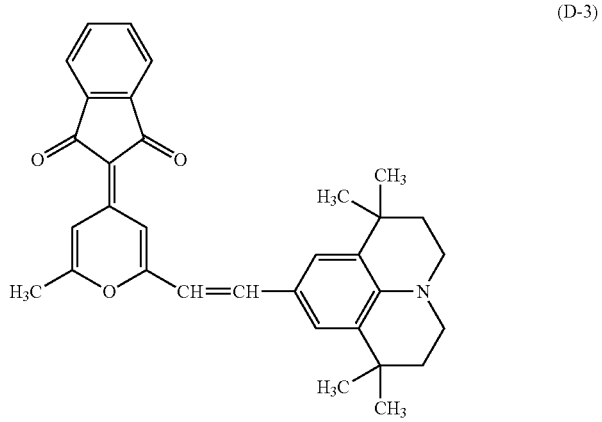

(D-3)

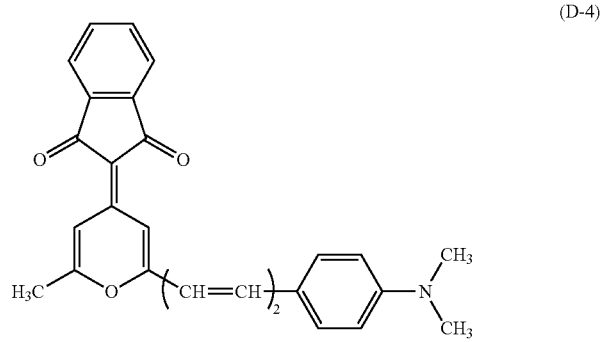

(D-4)

-continued
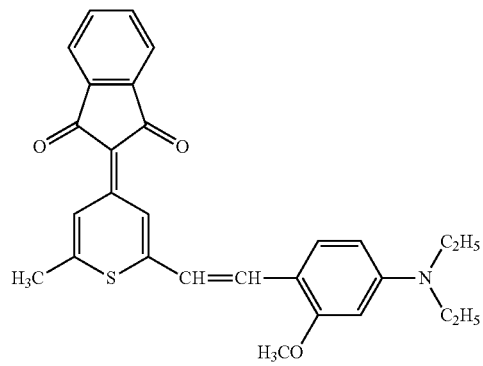
(D-5)
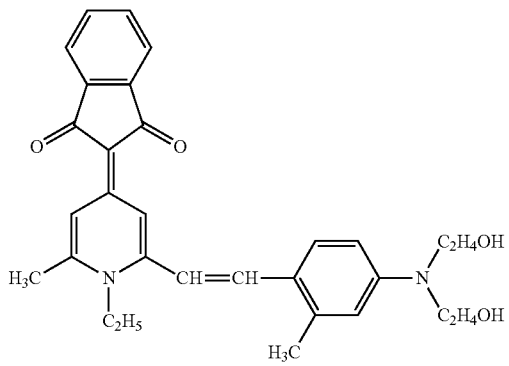
(D-6)
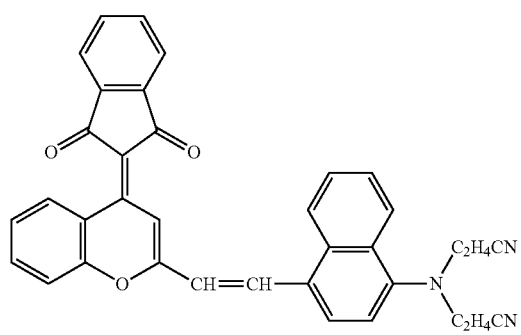
(D-7)
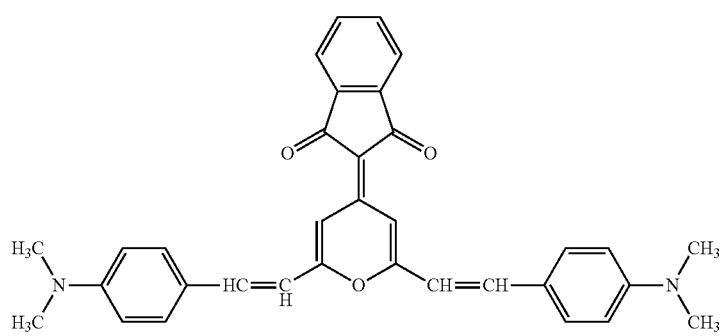
(D-8)
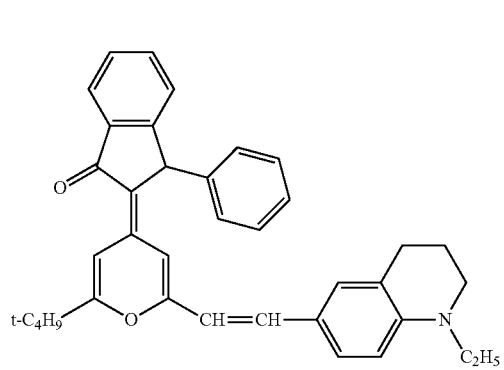
(D-9)
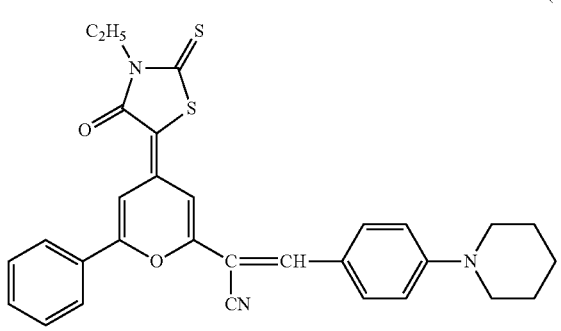
(D-10)

-continued
(D-11)
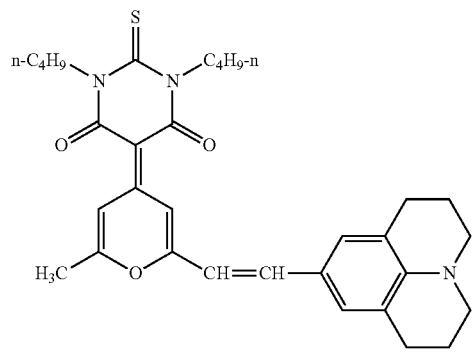
(D-12)
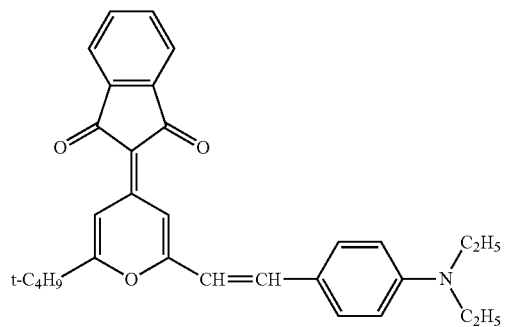
(D-13)
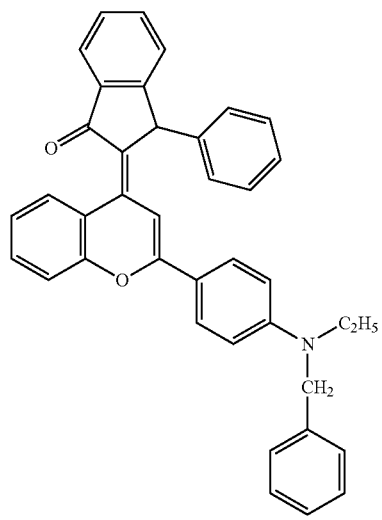
(D-14)
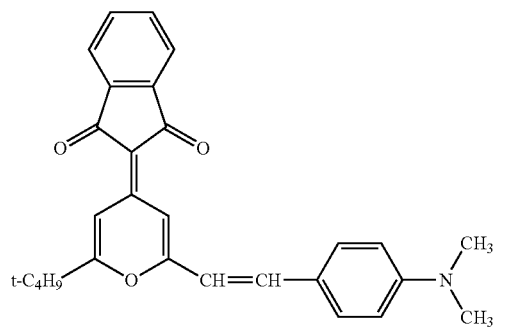
(D-15)
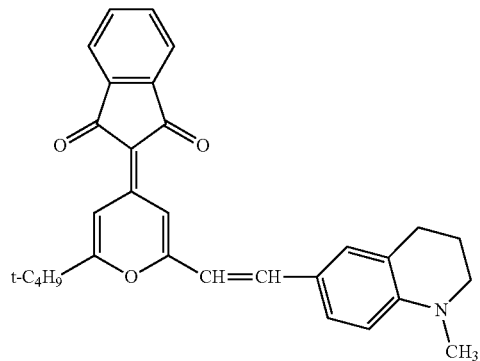
(D-16)
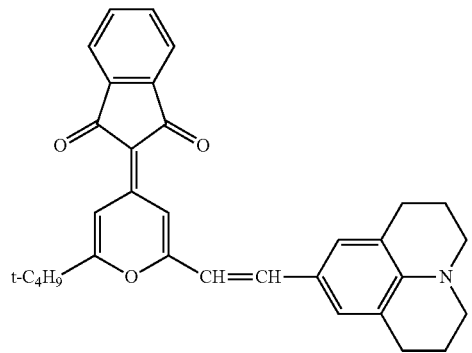
(D-17)
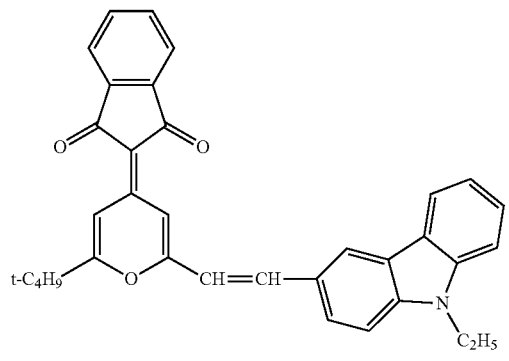
(D-18)
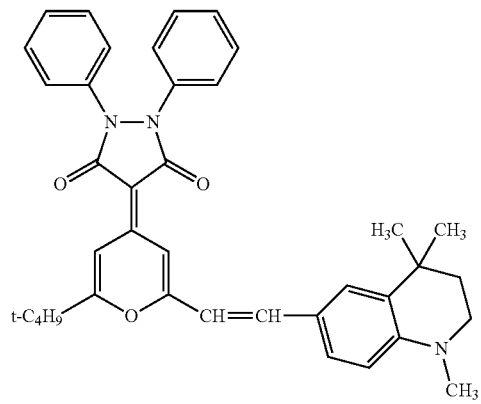

-continued
(D-19)
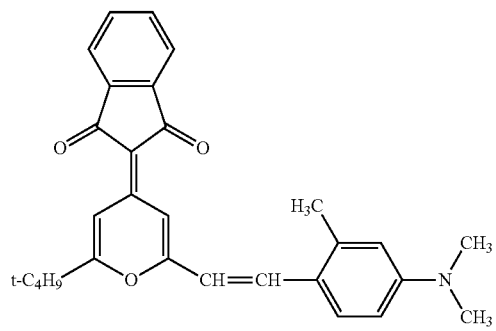
(D-20)
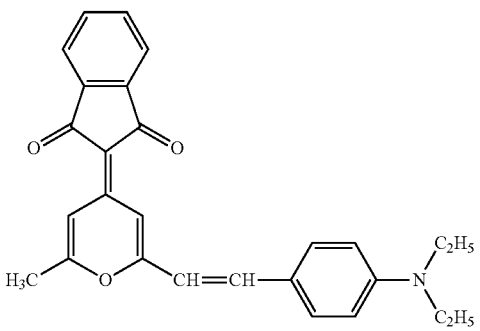
(D-21)
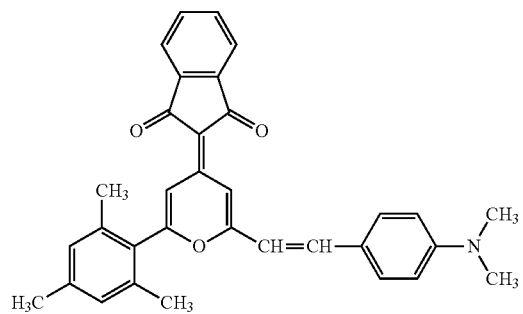
(D-22)
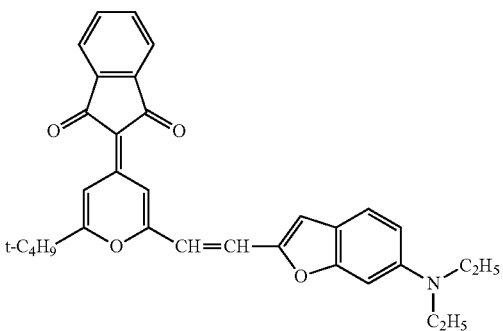
(D-23)
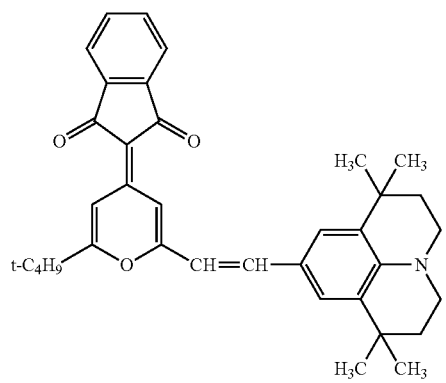
(D-24)
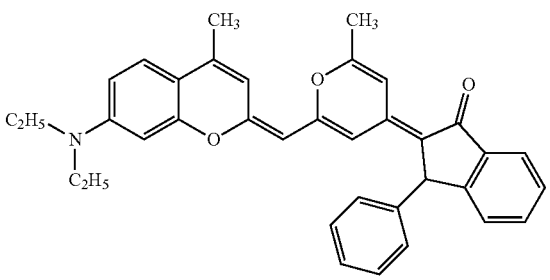
(D-25)
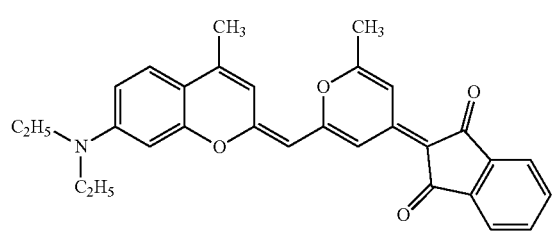
(D-26)
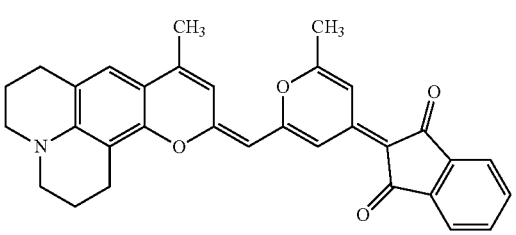
(D-27)
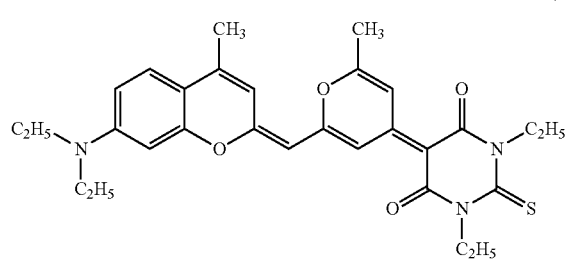
(D-28)
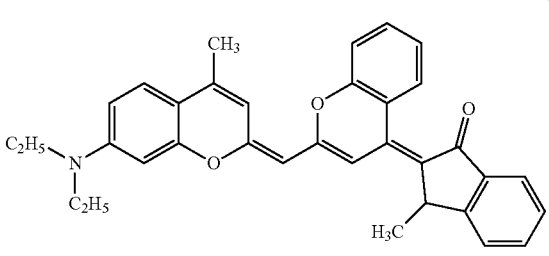

(D-29)
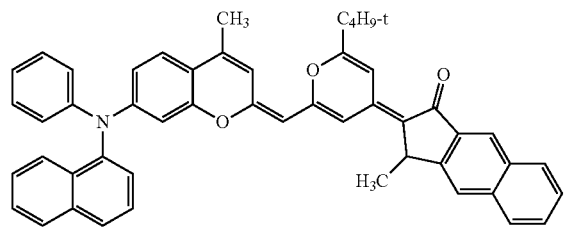
(D-30)
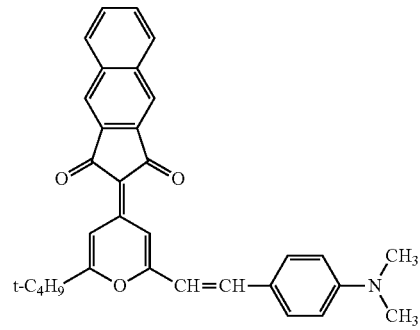
(D-31)
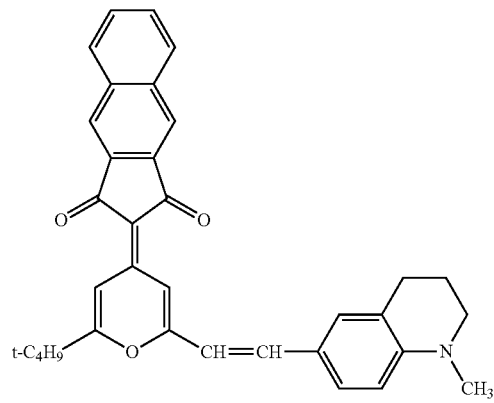
(D-32)
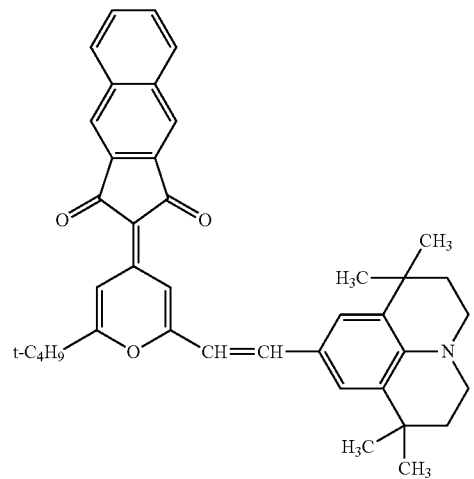
(D-33)
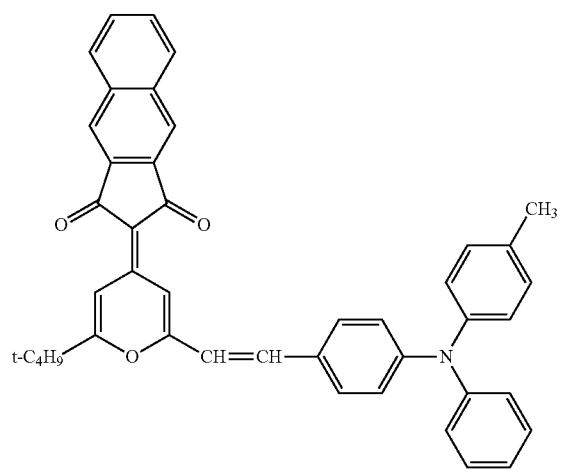
(D-34)
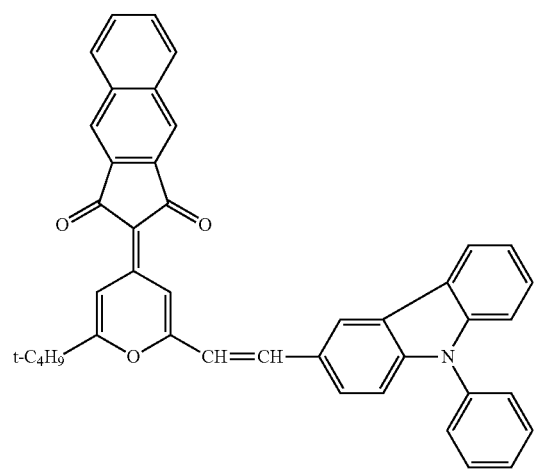

-continued
(D-35)
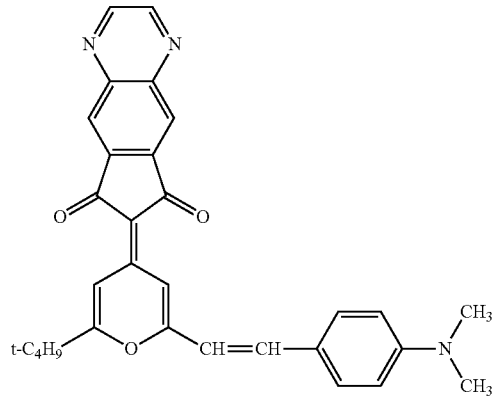
(D-36)
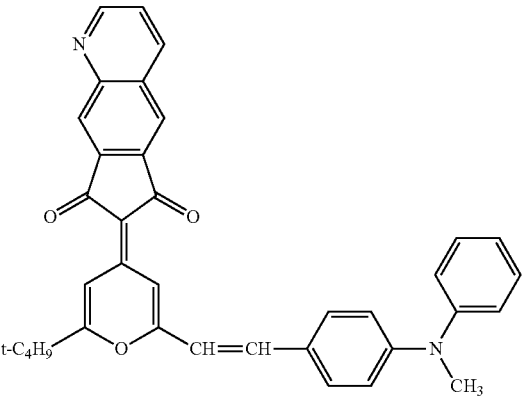
(D-37)
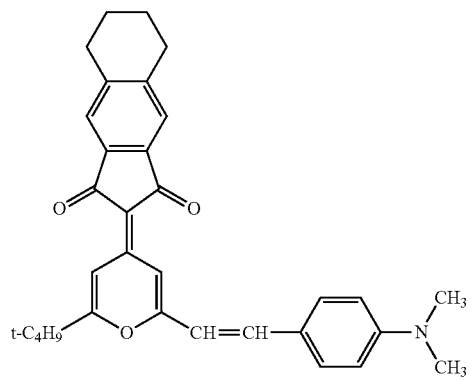
(D-38)
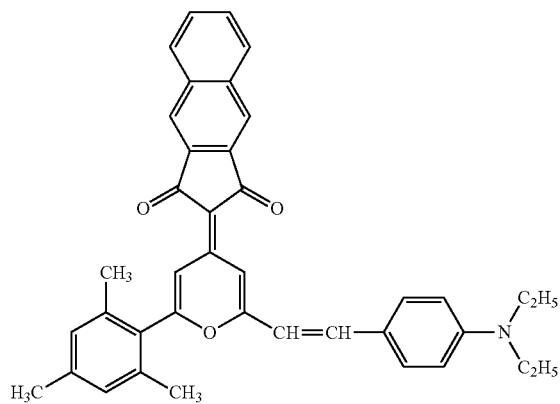
(D-39)
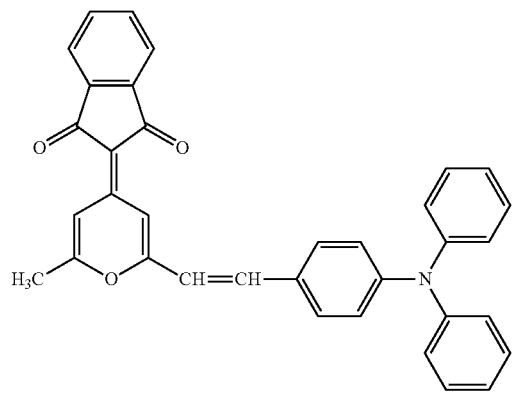
(D-40)
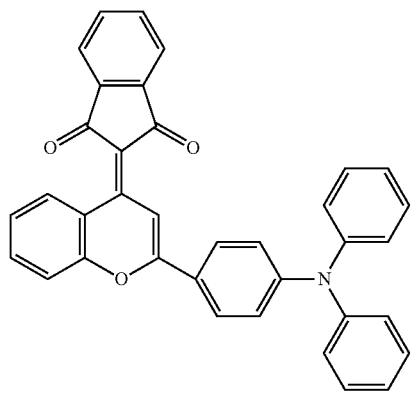
(D-41)
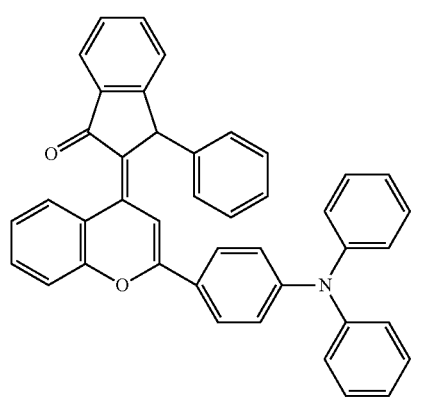
(D-42)
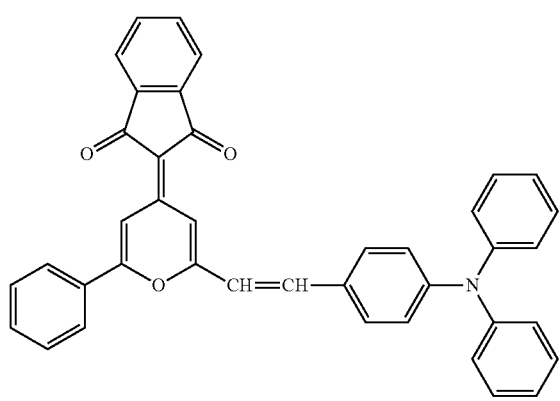

(D-43)
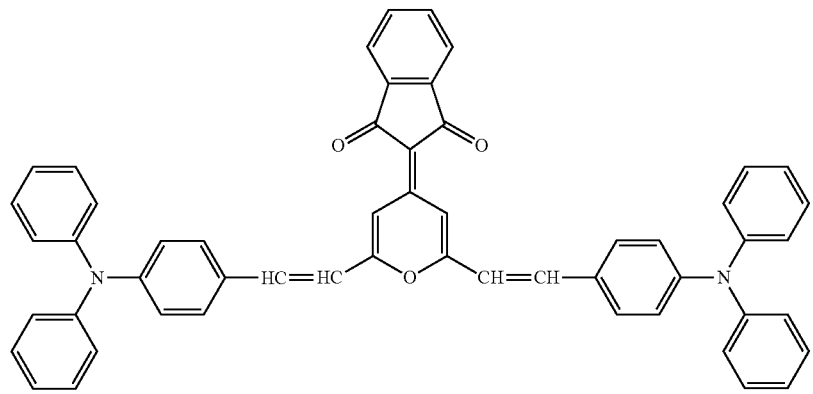
(D-44)
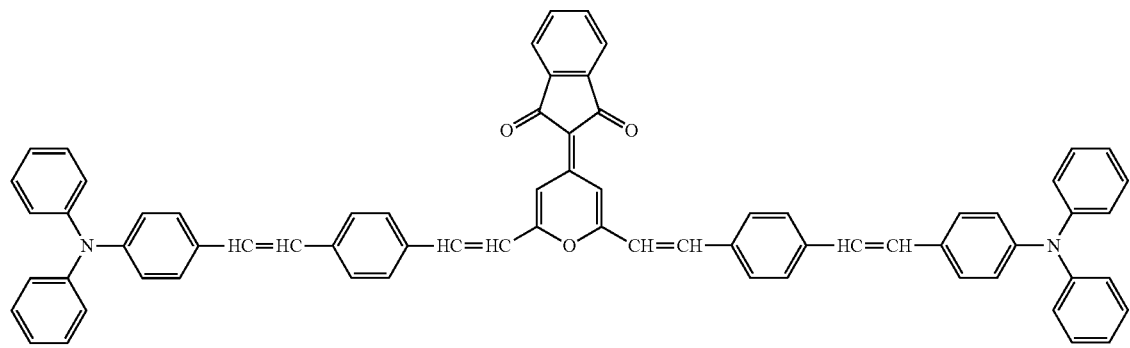
(D-45)
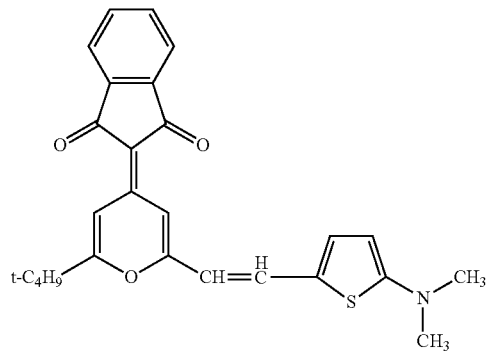
(D-46)
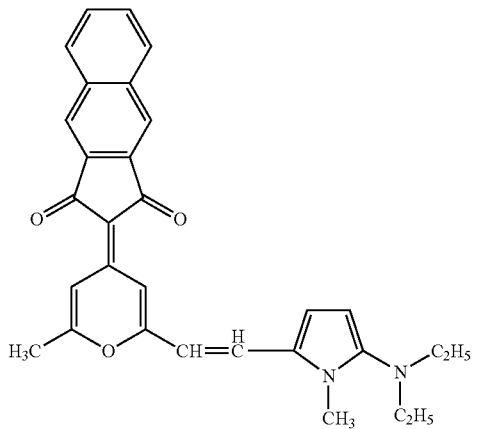
(D-47)
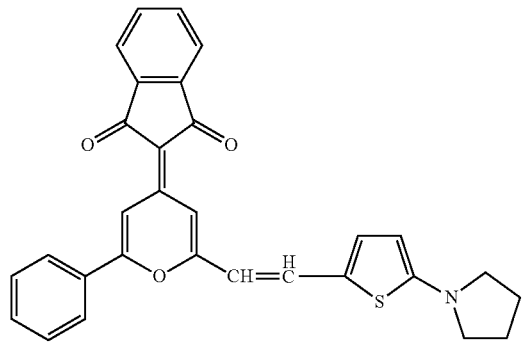
(D-48)
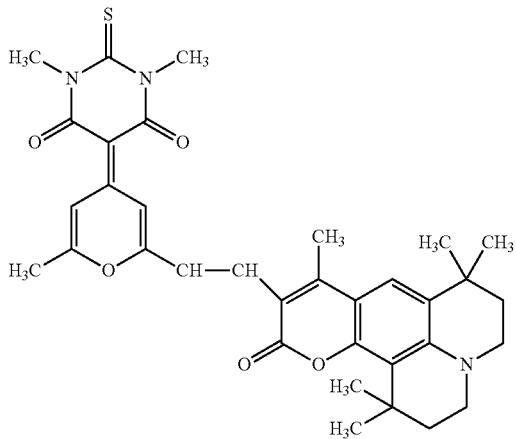

-continued
(D-49)
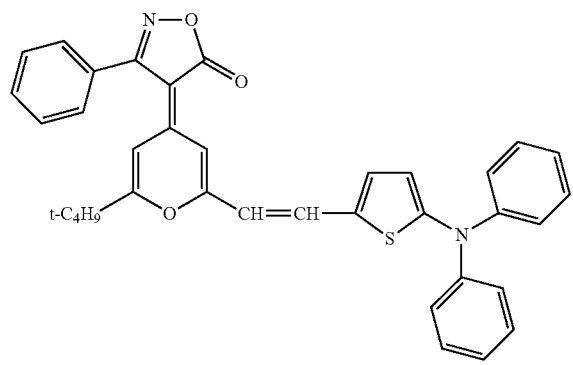
(D-50)
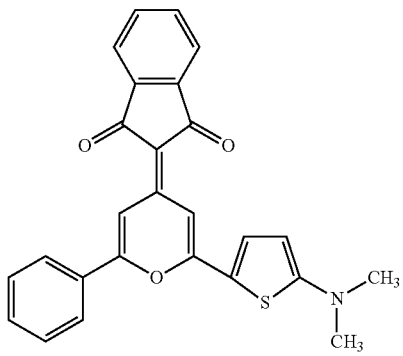
(D-51)
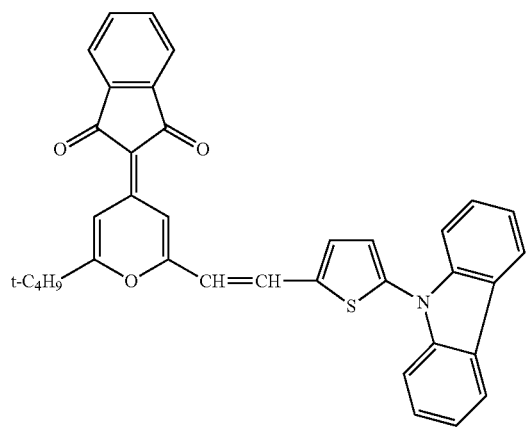
(D-52)
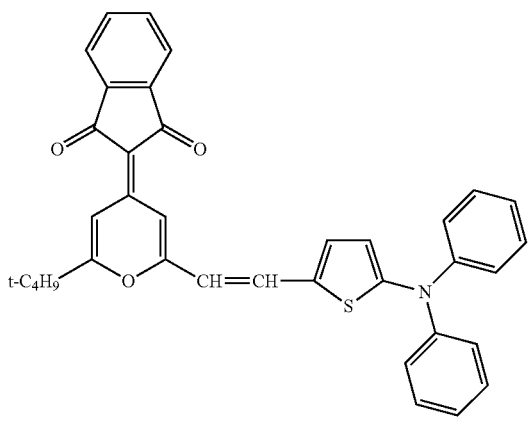
(D-53)
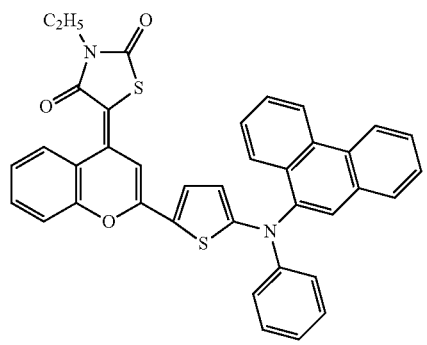
(D-54)
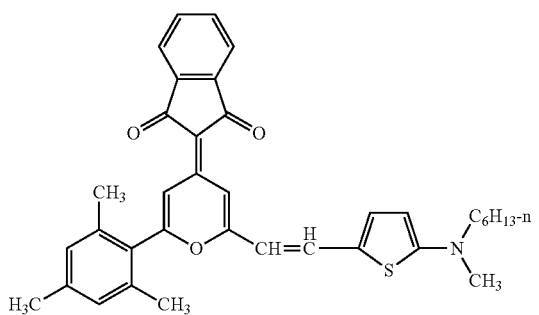
(D-55)
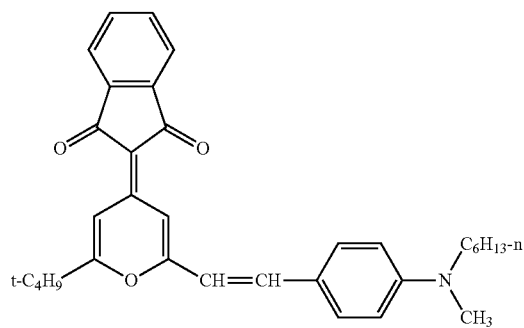
(D-56)
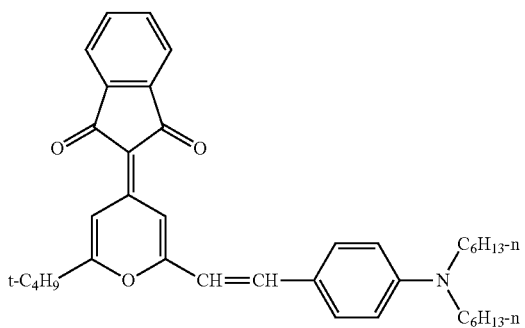

-continued
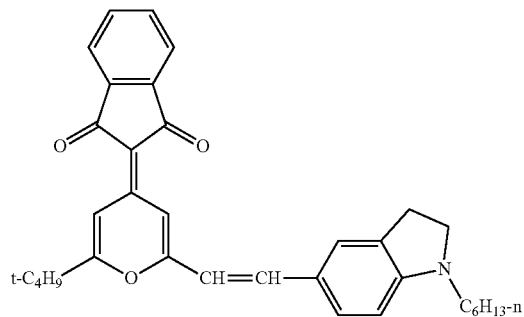
(D-57)
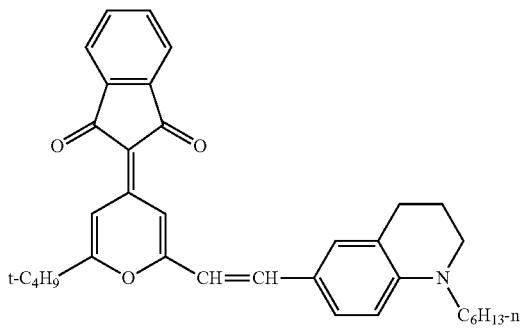
(D-58)
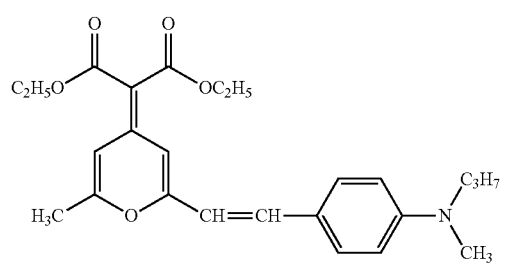
(D-59)
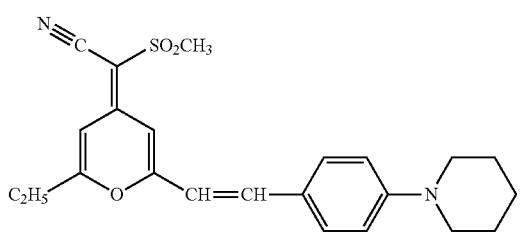
(D-60)
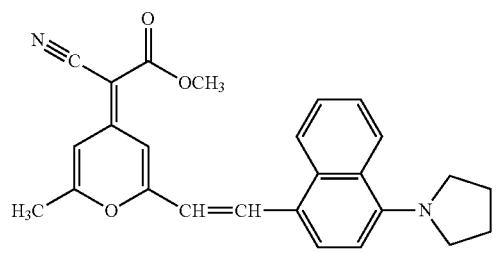
(D-61)
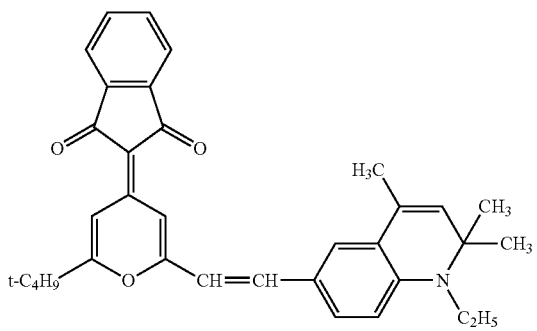
(D-62)
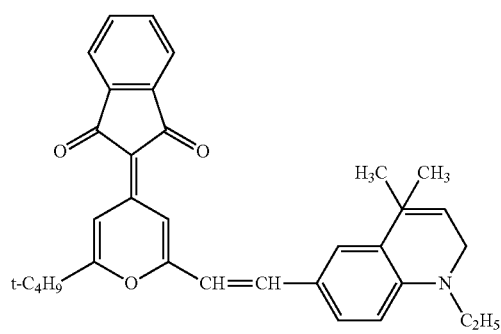
(D-63)
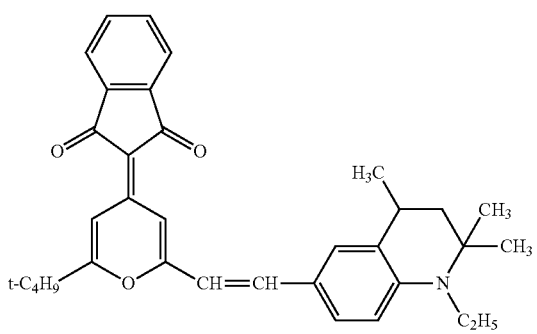
(D-64)

-continued
(D-65)
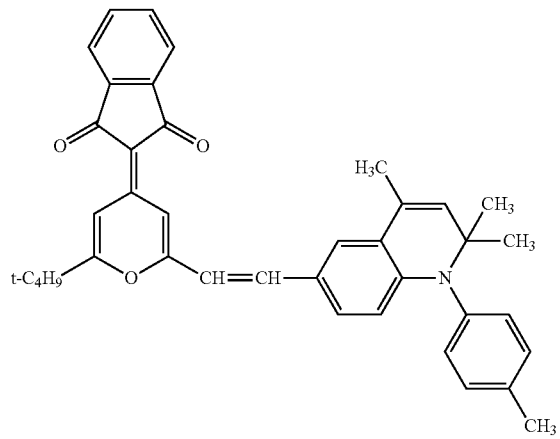
(D-66)
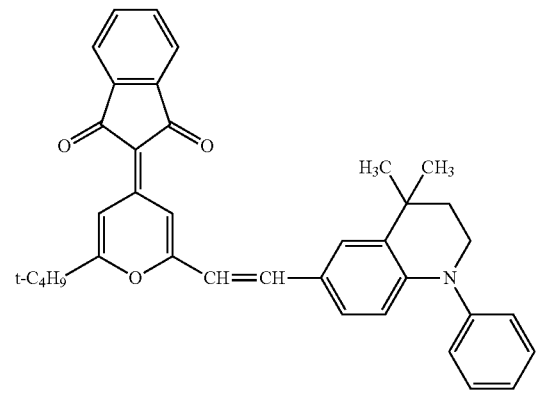
(D-67)
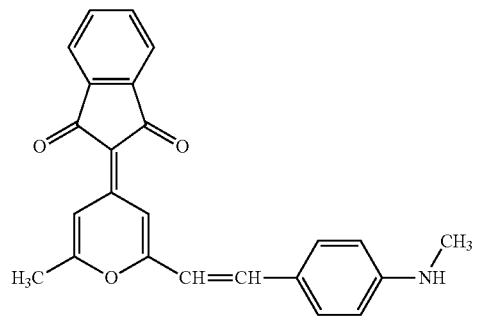
(D-68)
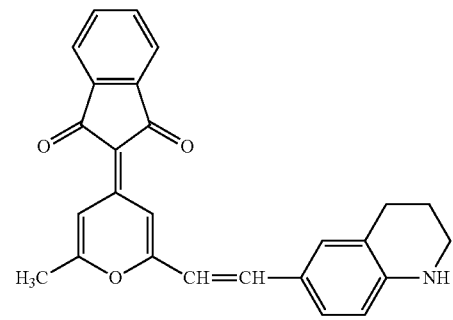
(D-69)
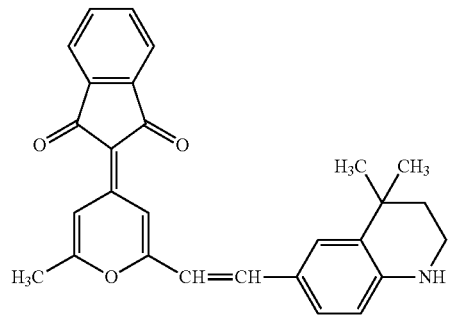
(D-70)
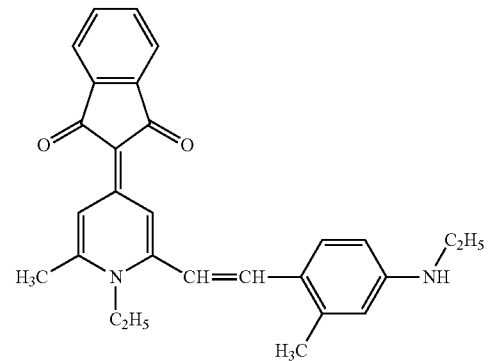
(D-71)
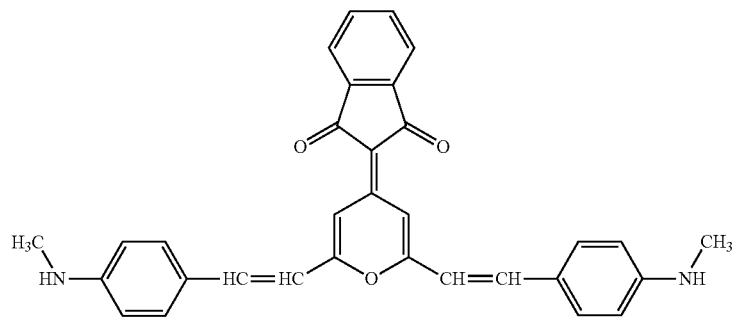

-continued
(D-72) 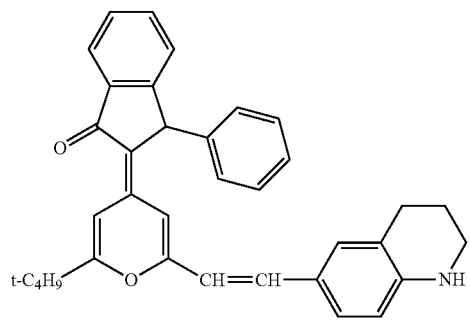
(D-73) 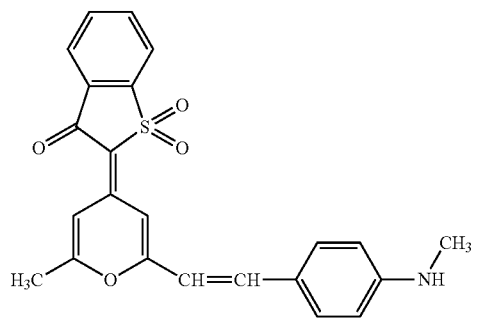
(D-74) 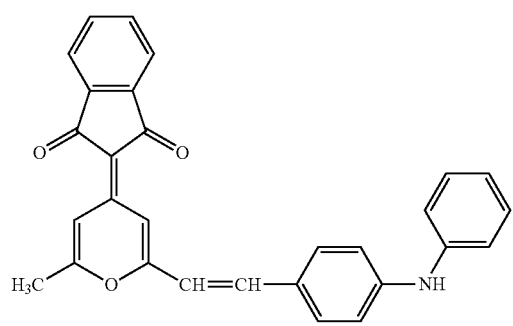
(D-75) 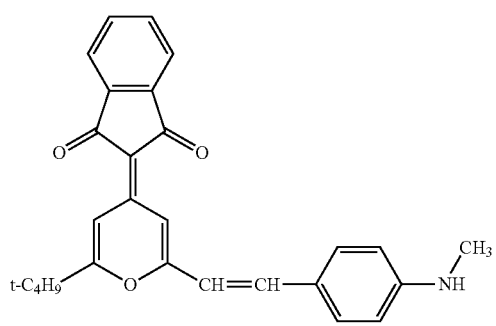
(D-76) 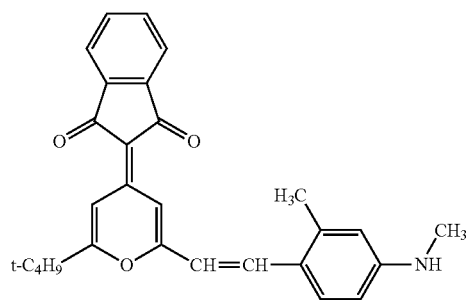
(D-77) 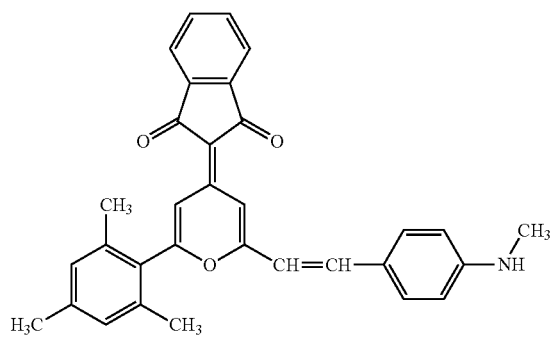
(D-78) 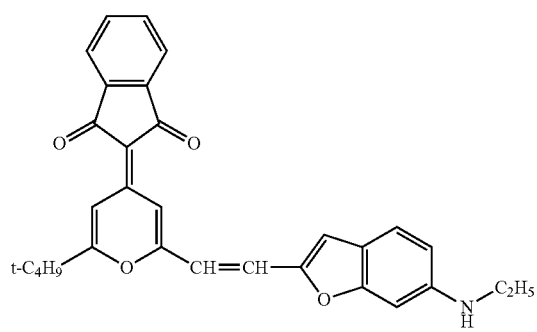
(D-79) 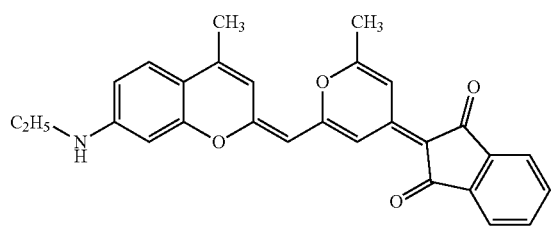

-continued
(D-80)
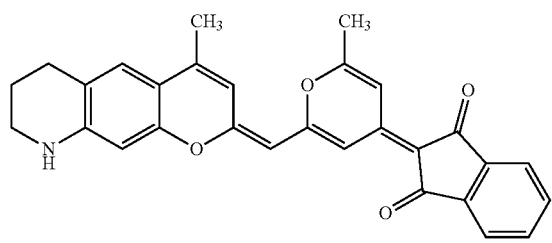
(D-81)
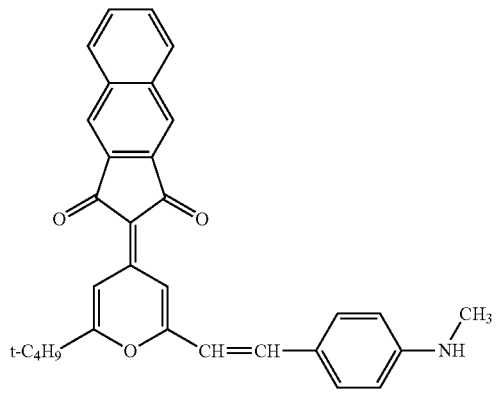
(D-82)
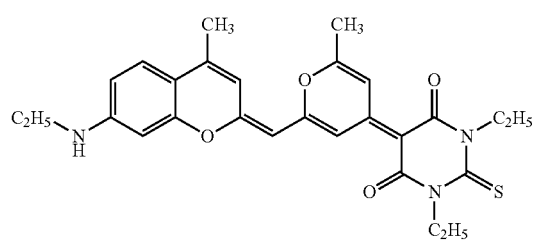
(D-83)
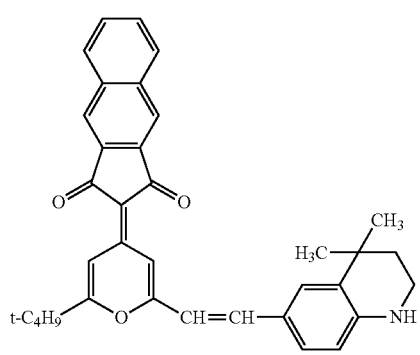
(D-84)
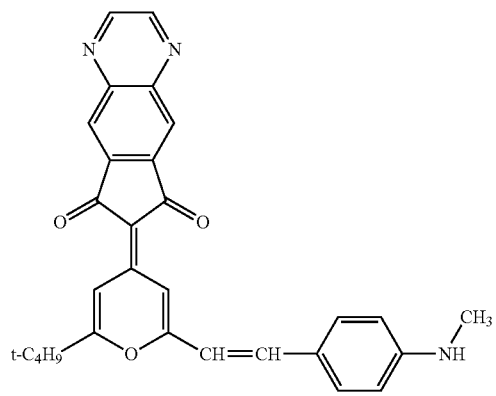
(D-85)
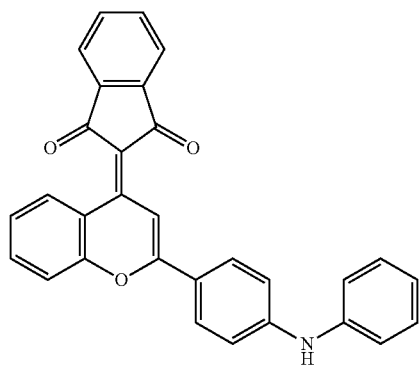
(D-86)
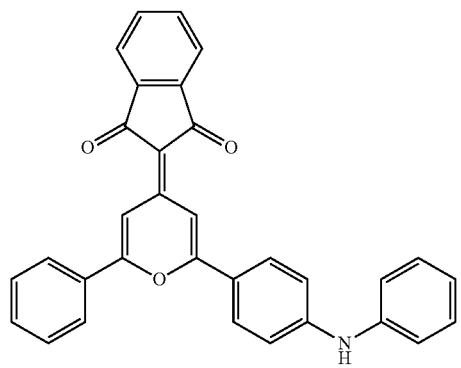
(D-87)
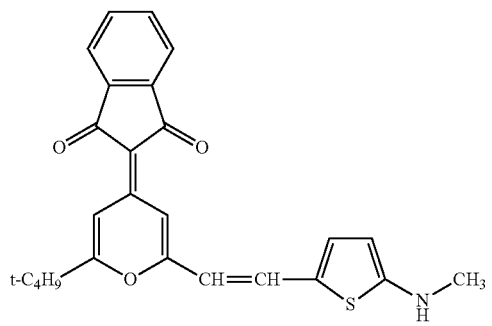

-continued
(D-88)
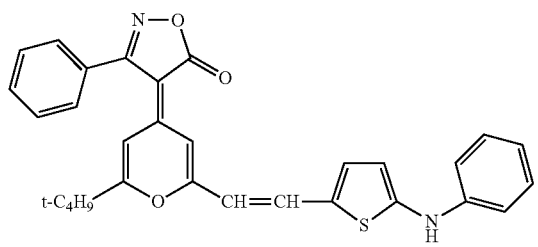
(D-89)
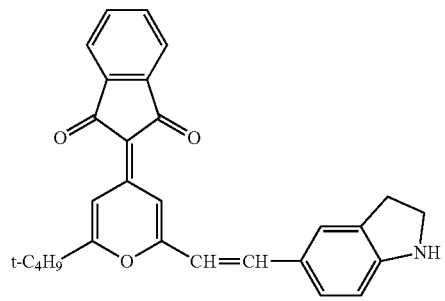
(D-90)
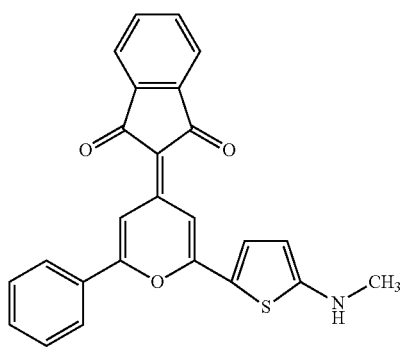
(D-91)
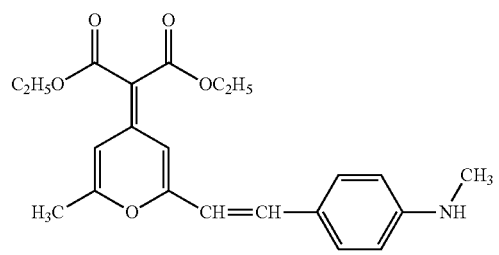
(D-92)
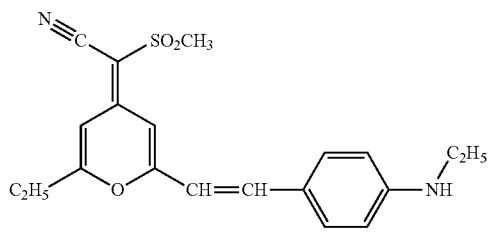
(D-93)
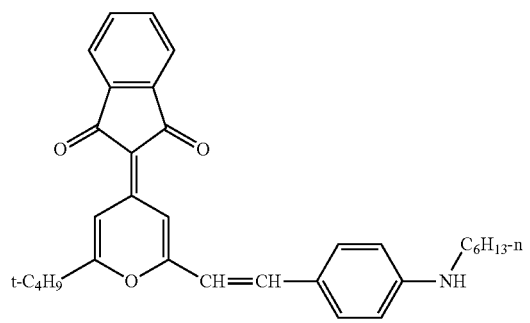
(D-94)
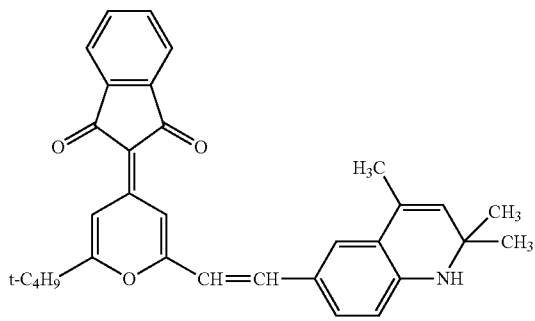
(D-95)
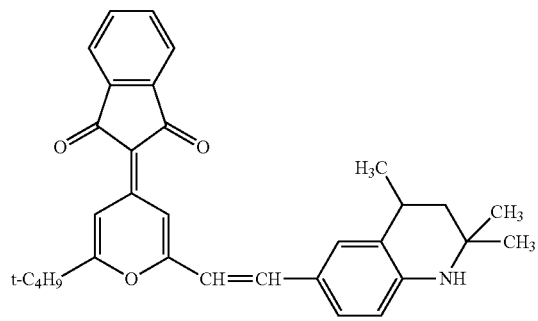

-continued
(D-96)
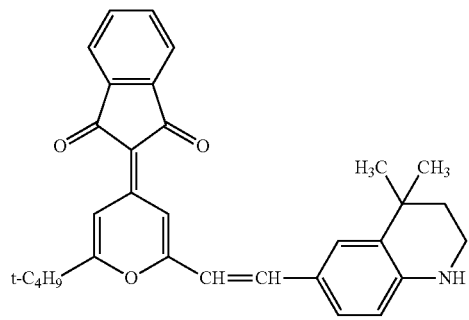
(D-97)
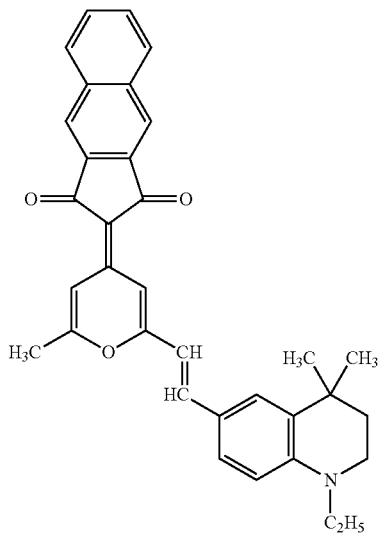
(D-98)
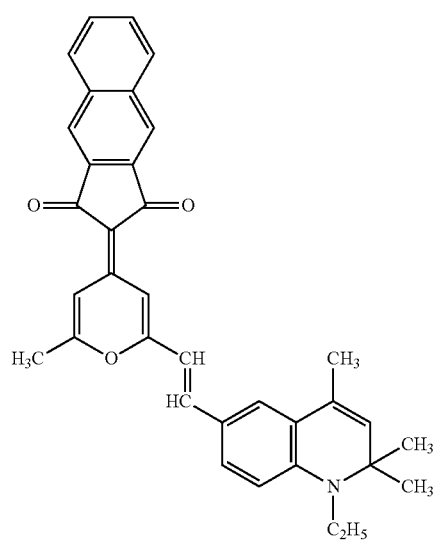
(D-99)
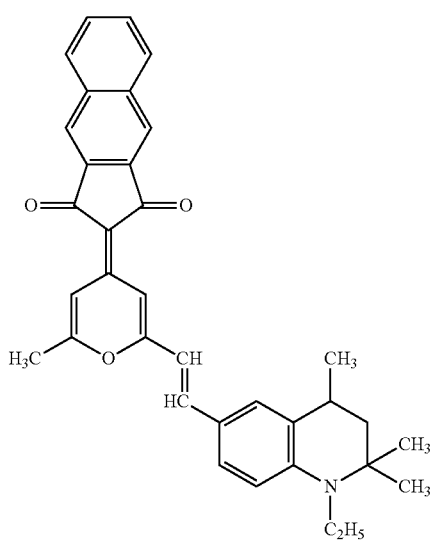
(D-100)
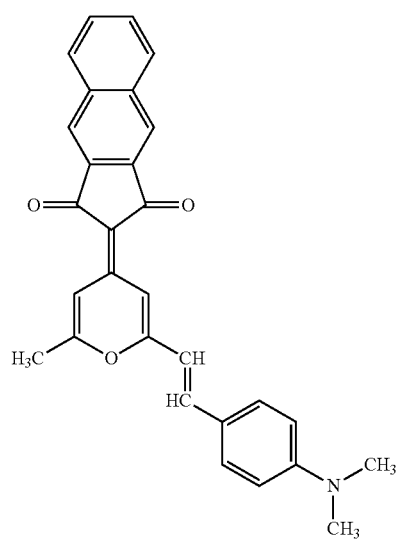
(D-101)
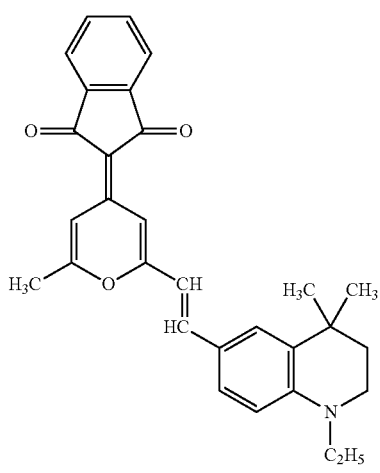

-continued

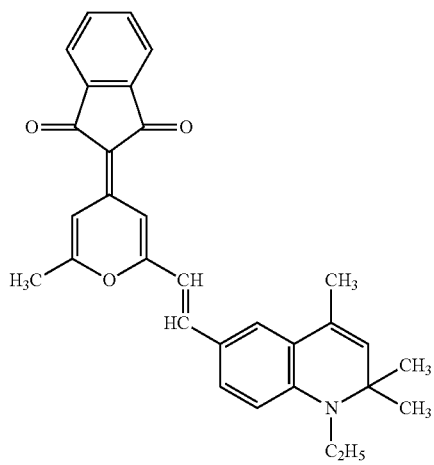
(D-102)

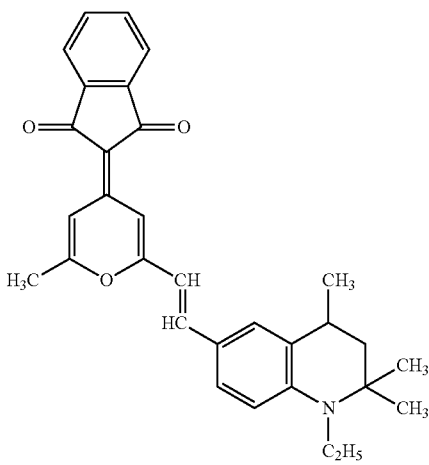
(D-103)

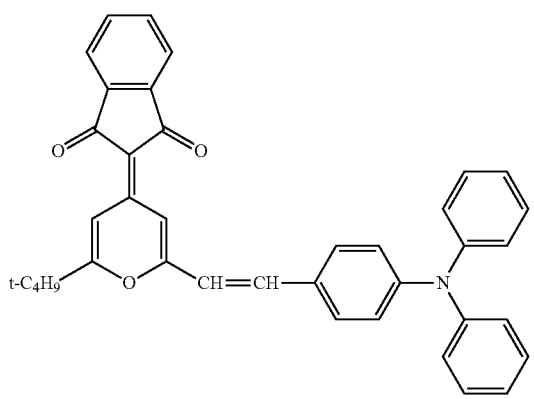
(D-104)

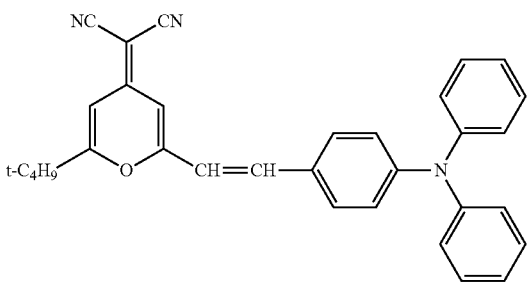
(D-105)

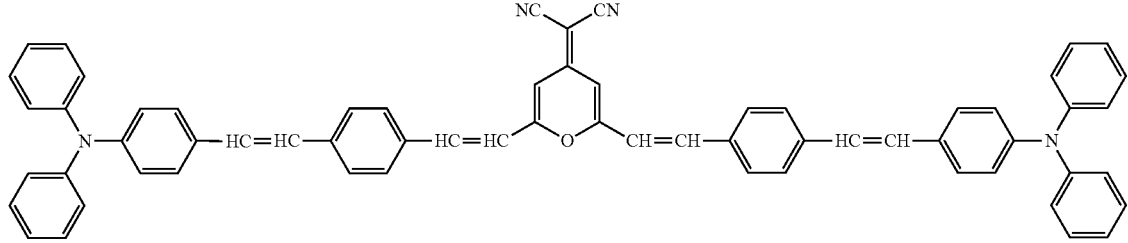
(D-106)

The compound containing the partial structures represented by each of the general formula (I) can be synthesized by various synthesis methods. For example, a method of formylating an aryl group of a di-substituted aniline structure and then allowing it to react with an active methylene compound in the absence or presence of a base, or the like can be applied. The synthesis can be performed by referring to methods described in, for example, JP-A-11-335661, JP-A-11-292875, JP-A-11-335368, JP-A-2000-351774, JP-A-2001-81451, etc.

Also, examples of the p-type organic material which is especially preferable for making the electron spin number small include a dye and a material not having 5 or more condensed ring structures (materials having from 0 to 4 condensed ring structures, and preferably from 1 to 3 condensed ring structures).

Also, when the photoelectric conversion layer 9 is made to have a bulk hetero structure, it is preferable that a difference between Ea (electron affinity) of the n-type organic material contained in the photoelectric conversion layer 9 and Ip (ionization potential) of the p-type organic material contained in the photoelectric conversion layer 9 is 1.0 eV or more. Also, Ip of the p-type organic material is preferably 5.2 eV or more. IP of the p-type organic material is more preferably 5.2 eV or more and not more than 5.7 eV.

Also, in order to suppress a free carrier to be generated due to impurities or the like, it is preferable to use a material having a small electron spin number for the material per se to be used for the photoelectric conversion layer 9, and it is preferable that the own electron spin number of the material (the value identified in the state of the material as it is but not in the state where the material has been subjected to thin film fabrication) is not more than $1.0 \times 10^{15}/cm^3$.

The imaging device having such a configuration is manufactured in the following manner. The insulating layer 5 is formed on the circuit substrate 1 having the charge accumulating part 2 and the read-out part 3 formed therein, and the contact part 4 is formed within the insulating layer 5. Subsequently, an electrode material is subjected to thin film fabrication on the contact part 4 and then subjected to patterning to form the plural pixel electrodes 6. Subsequently, the electron blocking layer 7, the photoelectric conversion layer 9 and the counter electrode 10 are successively formed on the plural pixel electrodes 6 to form the organic photoelectric conversion device P. On the occasion of forming this organic photoelectric conversion device P, the material and forming conditions of the photoelectric conversion layer 9 are determined such that the electron spin number of the photoelectric conversion layer 9 is not more than $1.0 \times 10^{15}/cm^3$, and theoretically 0. Subsequently, the sealing layer 11 and the color filter 12 are formed to complete the imaging device.

While a mode of undergoing the separation of light into its spectral components by the color filter 12 has been described, a constitution in which the color filter 12 is omitted, and the photoelectric conversion layer is made of a material having sensitivity to the G light or infrared light may also be adopted. Also, a structure in which three organic photoelectric conversion devices P are provided per pixel, and these three organic photoelectric conversion devices P are stacked in an upper portion of the substrate may be adopted. In that case, materials having sensitivity to red, blue and green lights, respectively may be chosen for the photoelectric conversion layer of each of the organic photoelectric conversion devices P contained in one pixel while omitting the color filter 12.

Also, there may be the case where it is preferable to subject the photoelectric conversion layer 9 to an annealing treatment at the time of or after the formation thereof. This is because there may be the case where by performing the annealing treatment, the dark current value depending upon an upwelling carrier in the inside of the photoelectric conversion layer 9 is reduced. Though a reason why the dark current value is reduced has not been elucidated yet, it may be considered that the internal state of the photoelectric conversion layer 9 is changed by the annealing treatment, and for example, when the junction state between the p-type material and the n-type material changes, a difference in energy level at which the upwelling carrier is generated increases (for example, the charge transfer from HOMO of the p-type material to LUMO of the n-type material is hardly caused following a change of the junction state), whereby the dark current is reduced. Even when the electron spin number immediately after the formation of the photoelectric conversion layer 9 falls without the scope of the invention, it is possible to reduce the dark current by performing the annealing treatment, thereby making the electron spin number fall within the scope of the invention.

There may be the case where it is preferable to perform the annealing treatment upon being divided plural times. This is because when the photoelectric conversion layer 9 is subjected to the annealing treatment at high temperatures all of a sudden, there may be the case where the internal state of the photoelectric conversion layer 9 abruptly changes, thereby causing an undesirable situation such as the generation of leakage. Specifically, it is preferable to perform the annealing treatment so as to prevent an abrupt change of the internal state of the photoelectric conversion layer 9 from occurring in such a manner that the temperature is divided plural times and increased step-by-step from the low temperature to the high temperature, or that the annealing treatment is performed plural times each for a short period of time while keeping the temperature constant.

Also, it is preferable to perform the annealing treatment in a state where a film which is hardly denatured by the annealing treatment is present on the photoelectric conversion layer 9. In general, in an organic film, a molecule which constitutes the organic film moves by the annealing treatment, whereby the film structure tends to change, an aspect of which is, however, variable depending upon materials and constitution to be used. When the annealing treatment is performed in a state where nothing is present on the surface of the organic film, since the molecule is easily movable, there is a concern that an abrupt change is easily caused, thereby generating the foregoing adverse influences. For that reason, by performing the annealing treatment in a state where a prescribed material film (for example, an upper electrode or a protective film) for preventing an abrupt change of the internal state of the photoelectric conversion layer 9 from occurring is present on the photoelectric conversion layer 9, it is possible to suppress the abrupt denaturation of the photoelectric conversion layer 9.

Also, it is possible to perform the annealing treatment while making it also serve as an annealing treatment to be performed at any one of the time of forming the sealing layer 11, the time of forming the color filter 12 or the time of reflow soldering at installing the imaging device in the circuit substrate. It is also possible to perform the annealing treatment separately as a new process. However, by making the annealing treatment also serve as other annealing treatment, it is possible to suppress an increase of the process number.

In order to suppress an excessive abrupt change of the photoelectric conversion layer, it is preferable to perform the annealing treatment at a temperature of not higher than Tg (glass transition temperature) of the material to be used for the photoelectric conversion layer.

However, in the case of forming a photoelectric conversion layer made of a mixture of a material with high Tg such as $C_{60}$ and a p-type organic material with lower Tg (for example, a photoelectric conversion dye), it does not matter that the annealing treatment is performed at a temperature of the Tg value of the p-type organic material or higher.

This is because as compared with the single-material film state, the thermal motion of the p-type organic molecule is suppressed due to an interaction between $C_{60}$ which is hardly thermally changed and the p-type organic material. When the photoelectric conversion layer is a mixed layer of $C_{60}$ and the p-type organic material, the annealing treatment is performed at a temperature of preferably not higher than ((Tg value of the p-type organic material)+120° C.), and more preferably not higher than ((Tg value of the p-type organic material)+100° C.).

When the annealing treatment is performed in a state where the foregoing prescribed material film is present on the photoelectric conversion layer, it does not matter that the annealing treatment is performed at a temperature higher than the Tg value of the material used in the photoelectric conversion layer.

This is because as compared with the state where nothing is present on the photoelectric conversion layer, in view of the fact that the film which is hardly thermally denatured is present on the photoelectric conversion layer, the molecule of the surface of the photoelectric conversion layer becomes in a hardly thermally denatured state, a thermal change of the layer surface as a place where the thermal motion starts is suppressed, and the whole of the layer is hardly denatured.

Examples of the foregoing prescribed material film include an upper electrode film such as ITO and a protective film such as an aluminum oxide film, a silicon oxide film, a silicon nitride film and an oxynitride film. When the prescribed material film which is hardly thermally denatured is present on the photoelectric conversion layer, the annealing treatment is performed at a temperature of preferably not higher than ((Tg value of the material used in the photoelectric conversion layer)+120° C.), and more preferably not higher than ((Tg value of the material used in the photoelectric conversion layer)+100° C.).

The Tg value of the organic material can be analyzed by means of usually known DSC (differential scanning colorimetry) or the like. Actually, there may be the case where a glass transition temperature in the layered state is not identical with a glass transition temperature of the material powder measured by the foregoing DSC. This is because an interaction state of an organic molecule in the layered state is different from an interaction state (association properties of molecules each other, etc.) of a powder. However, in general, since the layered state and the Tg value of a powder are well correlated with each other, it is possible to specify the layered state by the Tg value of the powder. It is possible to measure the Tg value in the layered state by means of a nanoscale thermal analysis which is available from SII Technologies, or the like.

The invention is hereunder described by reference to the following Examples.

EXAMPLES

Example 1

An imaging device equipped with an organic photoelectric conversion device was fabricated. However, in the imaging device, the formation of configurations above a counter electrode was omitted. The procedures are as follows.

First of all, amorphous ITO was subjected to thin film fabrication in a thickness of 30 nm on a CMOS substrate in which read-out circuits composed of a CMOS circuit and connection electrodes to be connected thereto had been formed, by a sputtering method, followed by patterning to form a pixel electrode on each of the connection electrodes. Subsequently, Compound 2 was subjected to thin film fabrication in a thickness of 100 nm on the plural pixel electrodes by a vacuum vapor deposition method, thereby forming an electron blocking layer. Subsequently, Compound 1 as a p-type organic material and fullerene ($C_{60}$) as an n-type organic material were subjected to thin film fabrication in a thickness as reduced into a single layer of 100 nm and 200 nm, respectively on the electron blocking layer by means of codeposition by a vacuum vapor deposition method (degree of vacuum: not more than $4 \times 10^{-4}$ Pa), thereby forming a photoelectric conversion layer. The photoelectric conversion layer was formed in a state where the temperature of the CMOS substrate was controlled at 25° C. Subsequently, amorphous ITO was subjected to thin film fabrication in a thickness of 10 nm on the photoelectric conversion layer by a sputtering method, thereby forming a counter electrode. There was thus completed an imaging device free from a color filter and a sealing layer.

The electron spin number of the photoelectric conversion layer of this imaging device was identified in the following manner. First of all, Compound 1 and fullerene ($C_{60}$) were subjected to thin film fabrication in a thickness as reduced into a single layer of 100 nm and 200 nm, respectively on a PEN (polyethylene naphthalate) substrate by means of codeposition by a vacuum vapor deposition method (degree of vacuum: not more than $4 \times 10^{-4}$ Pa), thereby forming a photoelectric conversion layer. The photoelectric conversion layer was formed in a state where the temperature of the substrate was controlled at 25° C. Thereafter, the PEN substrate was cut in an inert atmosphere without being exposed to the air and enclosed into a sample tube. Then, a sample enclosed in the sample tube was measured using an X-band ESR measurement system, a measured signals were separated into a signal with isotropy and a signal with anisotropy, and the amount of an isotropic signal component was calculated, thereby identifying the electron spin number.

Example 2

An imaging device was fabricated in the same manner as in Example 1, except that Compound 1 was changed to Compound 3, and the electron spin number of the photoelectric conversion layer was identified in the same manner as in Example 1.

Example 3

An imaging device was fabricated in the same manner as in Example 1, except that Compound 1 was changed to Compound 4, and the electron spin number of the photoelectric conversion layer was identified in the same manner as in Example 1.

Example 4

An imaging device was fabricated in the same manner as in Example 1, except that Compound 1 was changed to Compound 5, and the electron spin number of the photoelectric conversion layer was identified in the same manner as in Example 1.

Example 5

An imaging device was fabricated in the same manner as in Example 1, except that Compound 5 was subjected to thin film fabrication in a film thickness of 100 nm by a vacuum vapor deposition method, thereby forming a photoelectric conversion layer, and the electron spin number of the photoelectric conversion layer was identified in the same manner as in Example 1.

Example 6

An imaging device was fabricated in the same manner as in Example 1, except that Compound 6 was subjected to thin film fabrication in a film thickness of 100 nm by a vacuum vapor deposition method, thereby forming a photoelectric conversion layer, and the electron spin number of the photoelectric conversion layer was identified in the same manner as in Example 1.

Example 7

An imaging device was fabricated in the same manner as in Example 1, except that Compound 1 was changed to Compound 7, and the electron spin number of the photoelectric conversion layer was identified in the same manner as in Example 1.

Example 8

TiN was subjected to thin film fabrication in a thickness of 30 nm on a CMOS substrate in which read-out circuits composed of a CMOS circuit and connection electrodes to be connected thereto had been formed, followed by patterning to form a pixel electrode on each of the connection electrodes. Subsequently, Compound 8 was subjected to thin film fabrication in a thickness of 100 nm on the plural pixel electrodes by a vacuum vapor deposition method, thereby forming an electron blocking layer. Subsequently, Compound 3 as a p-type organic material and fullerene ($C_{60}$) as an n-type organic material were subjected to thin film fabrication in a thickness as reduced into a single layer of 100 nm and 200 nm, respectively on the electron blocking layer by means of codeposition by a vacuum vapor deposition method (degree of vacuum: not more than $4 \times 10^{-4}$ Pa), thereby forming a photoelectric conversion layer. The photoelectric conversion layer was formed in a state where the temperature of the CMOS substrate was controlled at 25° C. Subsequently, amorphous ITO was subjected to thin film fabrication in a thickness of 10 nm on the photoelectric conversion layer by a sputtering method, thereby forming a counter electrode. Thereafter, as sealing layers, an $AlO_{1.8}$ film was subjected to thin film fabrication in a thickness of 200 nm using an ALCVD (atomic layer chemical vapor deposition) apparatus under a condition of 125° C., and an $SiO_{1.3}N_{0.4}$ film was subjected to thin film fabrication in a thickness of 100 nm by a sputtering method, thereby fabricating an imaging device free from a color filter; and the electron spin number of the photoelectric conversion layer was identified in the same manner as in Example 1.

Example 9

An imaging device was fabricated in the same manner as in Example 8, except that after fabricating the sealing layers, an annealing treatment was performed at 200° C. for 30 minutes; and the electron spin number of the photoelectric conversion layer was identified in the same manner as in Example 1, except that the sample for identifying the electron spin number was also subjected to annealing at 200° C. for 30 minutes and then measured.

Example 10

An imaging device was fabricated in the same manner as in Example 8, except that Compound 3 was changed to Compound 4, and the electron spin number of the photoelectric conversion layer was identified in the same manner as in Example 1.

Example 11

An imaging device was fabricated in the same manner as in Example 9, except that Compound 3 was changed to Compound 4, and the electron spin number of the photoelectric conversion layer was identified in the same manner as in Example 9.

Example 12

An imaging device was fabricated in the same manner as in Example 8, except that Compound 3 was changed to Compound 7, and the electron spin number of the photoelectric conversion layer was identified in the same manner as in Example 1.

Example 13

An imaging device was fabricated in the same manner as in Example 9, except that Compound 3 was changed to Compound 7, and the electron spin number of the photoelectric conversion layer was identified in the same manner as in Example 9.

Example 14

An imaging device was fabricated in the same manner as in Example 12, except that after fabricating the sealing layers, an annealing treatment at 200° C. for 5 minutes was performed 6 times; and the electron spin number of the photoelectric conversion layer was identified in the same manner as in Example 1, except that the sample for identifying the electron spin number was also subjected to annealing at 200° C. for 5 minutes 6 times and then measured.

Example 15

An imaging device was fabricated in the same manner as in Example 12, except that after fabricating the sealing layers, the formation of a color filter on the device was carried out. With respect to the color filter formation process, dehydrobaking (at 200° C. for 5 minutes), color resist coating, prebaking (at 110° C. for 2 minutes), exposure, development and post-baking (at 200° C. for 5 minutes) were performed for one color resist, and the color film formation process was performed for each of three kinds of blue, green and red color resists (the annealing at 200° C. was performed for 30 minutes in total). With respect to the sample for identifying the electron spin number, the electron spin number of the photoelectric conversion layer was identified in the same manner as in Example 14.

Comparative Example 1

An imaging device was fabricated in the same manner as in Example 1, except that Compound 1 was changed to Compound 6, and the electron spin number of the photoelectric conversion layer was identified in the same manner as in Example 1.

Comparative Example 2

An imaging device was fabricated in the same manner as in Example 1, except that Compound 1 was changed to SnPc (tin phthalocyanine), and the electron spin number of the photoelectric conversion layer was identified in the same manner as in Example 1.

Compoud 1
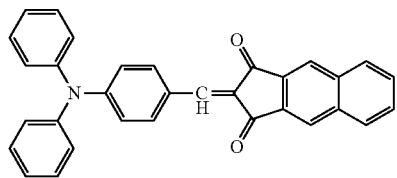
Compoud 2
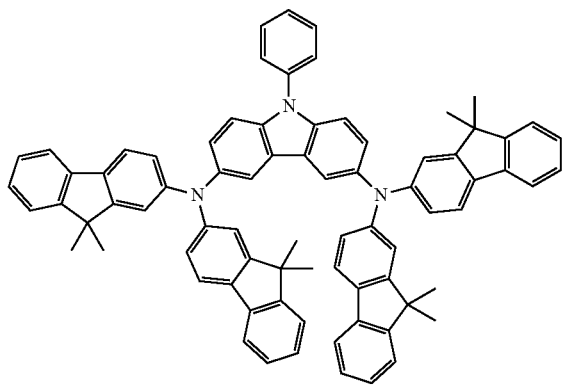
Compoud 3
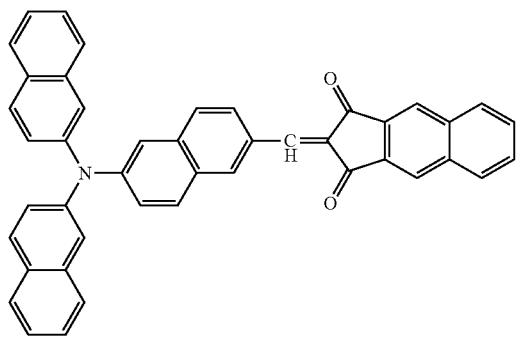
Compoud 4
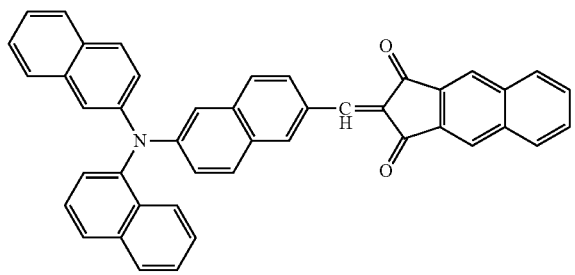
Compoud 5
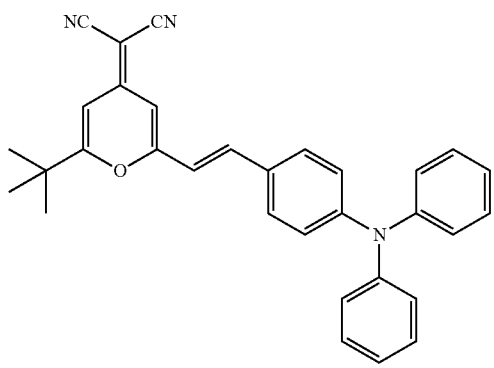
Compoud 6
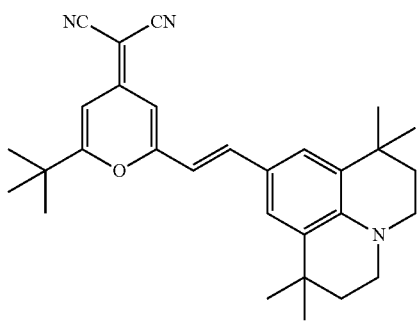
Compoud 7
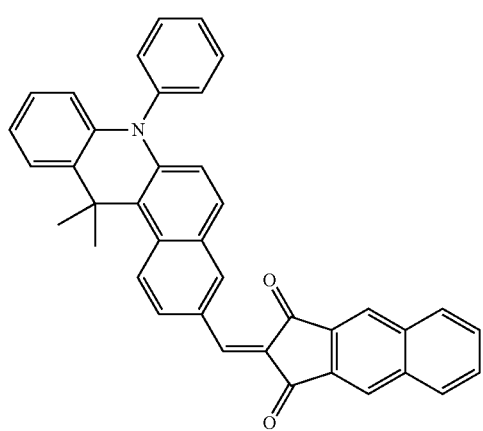

-continued

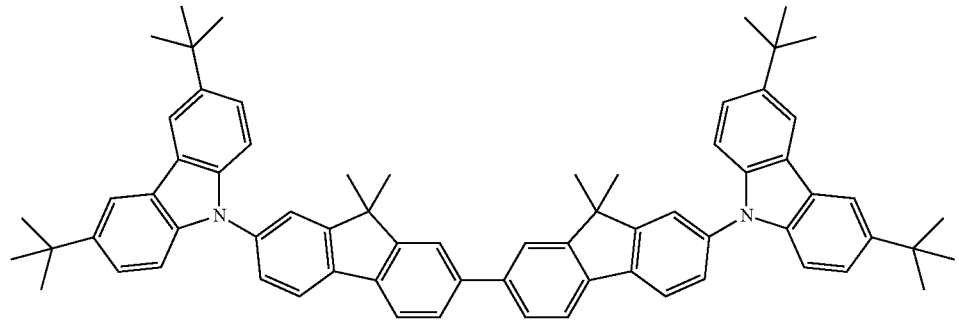

Compound 8

In the case of impressing an electric field of $2.0 \times 10^5$ V/cm between the pixel electrode and the counter electrode of each of the imaging devices fabricated in Examples 1 to 15 and Comparative Examples 1 to 2, a dark current density was measured. Table 2 shows a dark current density (a relative value when the value of Example 1 is defined as 1) of each of the imaging devices, an electron spin number of the photoelectric conversion layer of each of the imaging devices and an Ip value of the p-type organic material used in the photoelectric conversion layer of each of the imaging devices. The Ip was measured by AC-2 (manufactured by Riken Keiki Co., Ltd.) upon thin film fabrication of 100 nm of a material single layer on a glass substrate. Also, as to Tg, a raw material powder of the material was measured by DSC and identified.

Also, it was noted from the comparison of the results shown in Table 2 between Example 8 and Example 9, between Example 10 and Example 11, and between Example 12 and Example 13 that the electron spin number (dark current) is reduced by the annealing treatment.

Also, it was noted from the comparison between Examples 13 and 14 that it is possible to more reduce the electron spin number (dark current) by dividing the annealing treatment plural times; and that it was noted from the comparison between Examples 13 and 15 that the annealing treatment can be made to also serve as a color resist formation process.

Also, as noted from each of the comparison between Example 5 and Example 4 and the comparison between Example 6 and Comparative Example 1, in the layer made of

TABLE 2

| | Constitution of photoelectric conversion layer | Dark current density (relative value) | Ip of p-type organic material (eV) | Tg of p-type organic material (° C.) | Electron spin number (per cm³) |
|---|---|---|---|---|---|
| Example 1 | Codeposited layer of Compound 1 (corresponding to 100 nm) and $C_{60}$ (corresponding to 200 nm) | 1.0 | 5.5 | 98 | $2.0 \times 10^{13}$ |
| Example 2 | Codeposited layer of Compound 3 (corresponding to 100 nm) and $C_{60}$ (corresponding to 200 nm) | 1.0 | 5.5 | 146 | $6.9 \times 10^{13}$ |
| Example 3 | Codeposited layer of Compound 4 (corresponding to 100 nm) and $C_{60}$ (corresponding to 200 nm) | 0.9 | 5.5 | 145 | $4.3 \times 10^{12}$ |
| Example 4 | Codeposited layer of Compound 5 (corresponding to 100 nm) and $C_{60}$ (corresponding to 200 nm) | 0.9 | 5.5 | — | $9.8 \times 10^{14}$ |
| Example 5 | Compound 5 (100 nm) alone | 0.3 | 5.5 | — | $5.0 \times 10^{14}$ |
| Example 6 | Compound 6 (100 nm) alone | 0.3 | 5.1 | — | $2.2 \times 10^{14}$ |
| Example 7 | Codeposited layer of Compound 7 (corresponding to 100 nm) and $C_{60}$ (corresponding to 200 nm) | 0.87 | 5.5 | 142 | $3.5 \times 10^{13}$ |
| Example 8 | Codeposited layer of Compound 3 (corresponding to 100 nm) and $C_{60}$ (corresponding to 200 nm) | 0.60 | 5.5 | 146 | $6.9 \times 10^{13}$ |
| Example 9 | Codeposited layer of Compound 3 (corresponding to 100 nm) and $C_{60}$ (corresponding to 200 nm) (annealed at 200° C. for 30 minutes) | 0.33 | 5.5 | 146 | $4.2 \times 10^{13}$ |
| Example 10 | Codeposited layer of Compound 4 (corresponding to 100 nm) and $C_{60}$ (corresponding to 200 nm) | 0.40 | 5.5 | 145 | $4.3 \times 10^{12}$ |
| Example 11 | Codeposited layer of Compound 4 (corresponding to 100 nm) and $C_{60}$ (corresponding to 200 nm) (annealed at 200° C. for 30 minutes) | 0.19 | 5.5 | 145 | $1.9 \times 10^{12}$ |
| Example 12 | Codeposited layer of Compound 7 (corresponding to 100 nm) and $C_{60}$ (corresponding to 200 nm) | 0.42 | 5.5 | 142 | $3.5 \times 10^{13}$ |
| Example 13 | Codeposited layer of Compound 7 (corresponding to 100 nm) and $C_{60}$ (corresponding to 200 nm) (annealed at 200° C. for 30 minutes) | 0.13 | 5.5 | 142 | $2.0 \times 10^{13}$ |
| Example 14 | Codeposited layer of Compound 7 (corresponding to 100 nm) and $C_{60}$ (corresponding to 200 nm) (annealed 6 times each at 200° C. for 5 minutes) | 0.12 | 5.5 | 142 | $1.8 \times 10^{13}$ |
| Example 15 | Codeposited layer of Compound 7 (corresponding to 100 nm) and $C_{60}$ (corresponding to 200 nm) (given with a color resist formation process) | 0.12 | 5.5 | 142 | $1.8 \times 10^{13}$ |
| Comparative Example 1 | Codeposited layer of Compound 6 (corresponding to 100 nm) and $C_{60}$ (corresponding to 200 nm) | 44.4 | 5.1 | — | $3.2 \times 10^{15}$ |
| Comparative Example 2 | Codeposited layer of SnPc (corresponding to 100 nm) and $C_{60}$ (corresponding to 200 nm) | 89.0 | 4.9 | — | $2.6 \times 10^{16}$ |

It was noted from the results of Table 2 that by regulating the electron spin number of the photoelectric conversion layer to not more than $1.0 \times 10^{15}$/cm³, the dark current can be significantly reduced. In other words, it was noted that by choosing the material of the photoelectric conversion layer so as to have an electron spin number of the photoelectric conversion layer of not more than $1.0 \times 10^{15}$/cm³, the dark current can be significantly reduced.

the p-type organic material alone and the mixed layer made of the p-type organic material and the n-type organic material, even when the p-type organic material contained in the respective layers is identical, the electron spin number is different. Namely, the electron spin number of the photoelectric conversion layer is not determined by each material alone to be contained in the photoelectric conversion layer but determined by an interaction of the respective materials. In consequence, it is noted that it is important to identify the electron spin number in the state where the material of the photoelectric conversion layer has been subjected to thin film fabrication but not the own electron spin number of the material.

As described above, the following matters are disclosed in this specification.

The disclosed organic photoelectric conversion device is an organic photoelectric conversion device comprising a first electrode; a second electrode opposing to the first electrode; and an organic material-containing photoelectric conversion layer provided between the first electrode and the second electrode, wherein an electron spin number of the photoelectric conversion layer is not more than $1.0\times10^{15}/cm^3$.

In the disclosed organic photoelectric conversion device, the photoelectric conversion layer is one obtained by subjecting an organic material to thin film fabrication.

In the disclosed organic photoelectric conversion device, the electron spin number is a value determined from an isotropic signal component among signals measured by an electron spin resonance apparatus.

In the disclosed organic photoelectric conversion device, the photoelectric conversion layer is one obtained by an annealing treatment at the time of or after the formation thereof.

In the disclosed organic photoelectric conversion device, the annealing treatment is performed upon being divided plural times.

In the disclosed organic photoelectric conversion device, the annealing treatment is performed in a state where a prescribed material film is formed on the photoelectric conversion layer.

In the disclosed organic photoelectric conversion device, the photoelectric conversion layer contains an n-type organic material.

In the disclosed organic photoelectric conversion device, the n-type organic material is a fullerene or a fullerene derivative.

In the disclosed organic photoelectric conversion device, the photoelectric conversion layer further contains a p-type organic material.

In the disclosed organic photoelectric conversion device, the p-type organic material is a dye or a material not having 5 or more condensed ring structures.

In the disclosed organic photoelectric conversion device, a difference between an electron affinity of the n-type organic material and an ionization potential of the p-type organic material is 1.0 eV or more.

In the disclosed organic photoelectric conversion device, an ionization potential of the p-type organic material is 5.2 eV or more.

In the disclosed organic photoelectric conversion device, an own electron spin number of the material constituting the photoelectric conversion layer is not more than $1.0\times10^{15}/cm^3$.

In the disclosed organic photoelectric conversion device, a value of an electron spin number of the photoelectric conversion layer at 60° C. is not more than 3 times the value at 25° C.

The disclosed imaging device comprises a plurality of the foregoing organic photoelectric conversion devices and a read-out part for reading out signals corresponding to charges generated in each of the photoelectric conversion devices.

The disclosed imaging apparatus comprises the foregoing imaging device.

The disclosed method for manufacturing an imaging device is a method for manufacturing an imaging device having plural organic photoelectric conversion devices and a read-out part for reading out signals corresponding to charged generated in each of the plural organic photoelectric conversion devices, wherein the organic photoelectric conversion device includes a first electrode for collecting the charges; a second electrode opposing to the first electrode; and a photoelectric conversion layer which is provided between the first electrode and second electrode and which generates the charges corresponding to incident light, and wherein the photoelectric conversion layer is formed such that an electron spin number of the photoelectric conversion layer is not more than $1.0\times10^{15}/cm^3$.

In the disclosed method for manufacturing an imaging device, the photoelectric conversion layer is one obtained by subjecting an organic material to thin film fabrication.

In the disclosed method for manufacturing an imaging device, the electron spin number is a value determined from an isotropic signal component among signals measured by an electron spin resonance apparatus.

In the disclosed method for manufacturing an imaging device, a step of performing an annealing treatment at the time of or after the formation thereof is included.

In the disclosed method for manufacturing an imaging device, the annealing treatment is performed upon being divided plural times.

In the disclosed method for manufacturing an imaging device, the annealing treatment is performed in a state where a prescribed material film is formed on the photoelectric conversion layer.

In the disclosed method for manufacturing an imaging device, an n-type organic material is used as a material of the photoelectric conversion layer.

In the disclosed method for manufacturing an imaging device, the n-type organic material is a fullerene or a fullerene derivative.

In the disclosed method for manufacturing an imaging device, a p-type organic material is further used as a material of the photoelectric conversion layer.

In the disclosed method for manufacturing an imaging device, the p-type organic material is a dye or a material not having 5 or more condensed ring structures.

In the disclosed method for manufacturing an imaging device, the respective materials constituting the photoelectric conversion layer are chosen such that a difference between an electron affinity of the n-type organic material and an ionization potential of the p-type organic material is 1.0 eV or more.

In the disclosed method for manufacturing an imaging device, a material having an ionization potential of 5.2 eV or more is used as the p-type organic material.

In the disclosed method for manufacturing an imaging device, a material having an own electron spin number of not more than $1.0\times10^{15}/cm^3$ is used as the material constituting the photoelectric conversion layer.

In the disclosed method for manufacturing an imaging device, a material of the photoelectric conversion layer is chosen such that a value of an electron spin number of the photoelectric conversion layer at 60° C. is not more than 3 times the value at 25° C.

While the present invention has been shown and described with reference to certain exemplary embodiments thereof, it will be understood by those skilled in the art that various changes modifications may be made therein without departing from the spirit and scope of the present invention as defined by the appended claims.

What is claimed is:

1. An organic photoelectric conversion device comprising:
a first electrode;
a second electrode opposing to the first electrode; and
an organic material-containing photoelectric conversion layer provided between the first electrode and the second electrode,
wherein the photoelectric conversion layer includes:
a p-type organic material represented by formula (B) or (C), where
(B) is

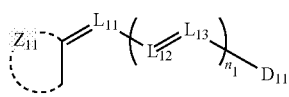

where $Z_{11}$ is a ring containing at least two carbon atoms and represents a 5-membered ring, a 6-membered ring or a condensed ring containing at least one of a 5-membered ring and a 6-membered ring, each of $L_{11}$, $L_{12}$ and $L_{13}$ independently represents an unsubstituted methine group or a substituted methine group, $D_{11}$ represents an arylene group or a hetero aromatic group containing —$NR^a(R^b)$ and each of $R^a$ and $R^b$ independently represents a hydrogen atom or a substituent, and $n_1$ represents an integer of 0 or more, and
where (C) is

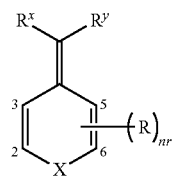

where X represents O or N—$R_{10}$, and $R_{10}$ represents a hydrogen atom or a substituent, each of $R^x$ and $R^y$ independently represents a hydrogen atom or a substituent, and at least one of them represents an electron-withdrawing group, and $R^x$ and $R^y$ may be connected to each other to form a ring; each R represents a bond, a hydrogen atom or a substituent, and at least of R's represents a bond (—), nr represents an integer of from 1 to 4, when nr is 2 or more, each R may be the same as or different from every other R, R's at the 2-position and 3-position, and R's at the 5-position and 6-position, may be connected to each other to form a ring;
wherein
an electron spin number of the photoelectric conversion layer is not more than $1.0 \times 10^{15}/cm^3$.

2. The organic photoelectric conversion device according to claim 1,
wherein
the photoelectric conversion layer is one obtained by subjecting an organic material to thin film fabrication.

3. The organic photoelectric conversion device according to claim 1,
wherein
the electron spin number is a value determined from an isotropic signal component among signals measured by an electron spin resonance apparatus.

4. The organic photoelectric conversion device according to claim 1, wherein
the photoelectric conversion layer is one obtained by an annealing treatment at the time of or after the formation thereof.

5. The organic photoelectric conversion device according to claim 4,
wherein
the annealing treatment is performed upon being divided plural times.

6. The organic photoelectric conversion device according to claim 4,
wherein
the annealing treatment is performed in a state where a prescribed material film is formed on the photoelectric conversion layer.

7. The organic photoelectric conversion device according to claim 1,
wherein
the photoelectric conversion layer comprises an n-type organic material.

8. The organic photoelectric conversion device according to claim 7,
wherein
the n-type organic material is a fullerene or a fullerene derivative.

9. The organic photoelectric conversion device according to claim 7,
wherein
the photoelectric conversion layer further comprises a p-type organic material.

10. The organic photoelectric conversion device according to claim 9,
wherein
the p-type organic material is a dye or a material not having 5 or more condensed ring structures.

11. The organic photoelectric conversion device according to claim 9, wherein
a difference between an electron affinity of the n-type organic material and an ionization potential of the p-type organic material is 1.0 eV or more.

12. The organic photoelectric conversion device according to claim 9,
wherein
an ionization potential of the p-type organic material is 5.2 eV or more.

13. The organic photoelectric conversion device according to claim 1, wherein
an own electron spin number of the material constituting the photoelectric conversion layer is not more than $1.0 \times 10^{15}/cm^3$.

14. The organic photoelectric conversion device according to claim 1,
wherein
a value of an electron spin number of the photoelectric conversion layer at 60° C. is not more than 3 times the value at 25° C.

15. An imaging device comprising:
a plurality of the organic photoelectric conversion devices according to claim 1; and
a read-out part for reading out signals corresponding to charges generated in each of the photoelectric conversion devices.

16. An imaging apparatus comprising the imaging device according to claim 15.

17. A method for manufacturing an imaging device having plural organic photoelectric conversion devices and a read-out part for reading out signals corresponding to charged generated in each of the plural organic photoelectric conversion devices,
wherein
the organic photoelectric conversion device comprises:
a first electrode for collecting the charges;
a second electrode opposing to the first electrode; and
a photoelectric conversion layer which is provided between the first electrode and second electrode and which generates the charges corresponding to incident light,
wherein the photoelectric conversion layer includes:
a p-type organic material represented by formula (B) or (C),
where (B) is

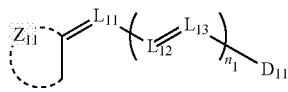

where $Z_{11}$ is a ring containing at least two carbon atoms and represents a 5-membered ring, a 6-membered ring or a condensed ring containing at least one of a 5-membered ring and a 6-membered ring; each of $L_{11}$, $L_{12}$ and $L_{13}$ independently represents an unsubstituted methine group or a substituted methine group; $D_{11}$ represents an arylene group or a hetero aromatic group containing —$NR^a(R^b)$ and each of $R^a$ and $R^b$ independently represents a hydrogen atom or a substituent, and $n_1$ represents an integer of 0 or more, and
where (C) is

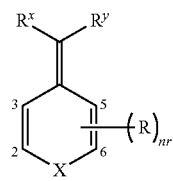

where X represents O or N—$R_{10}$ and $R_{10}$ represents a hydrogen atom or a substituent; each of $R^x$ and $R^y$ independently represents a hydrogen atom or a substituent, and at least one of them represents an electron-withdrawing group, and $R^x$ and $R^y$ may be connected to each other to form a ring, each R represents a bond, a hydrogen atom or a substituent, and at least of R's represents a bond (—), nr represents an integer of from 1 to 4, when nr is 2 or more, each R may be the same as or different from every other R, R's at the 2-position and 3-position, and R's at the 5-position and 6-position, may be connected to each other to form a ring;
wherein
the photoelectric conversion layer is formed such that an electron spin number of the photoelectric conversion layer is not more than $1.0 \times 10^{15}/cm^3$.

18. The method for manufacturing an imaging device according to claim 17,
wherein
the photoelectric conversion layer is formed by subjecting an organic material to thin film fabrication.

19. The method for manufacturing an imaging device according to claim 17,
wherein
the electron spin number is a value determined from an isotropic signal component among signals measured by an electron spin resonance apparatus.

20. The method for manufacturing an imaging device according to claim 17 further comprising performing an annealing treatment at the time of or after the formation thereof is included.

21. The method for manufacturing an imaging device according to claim 20,
wherein
the annealing treatment is performed upon being divided plural times.

22. The method for manufacturing an imaging device according to claim 20,
wherein
the annealing treatment is performed in a state where a prescribed material film is formed on the photoelectric conversion layer.

23. The method for manufacturing an imaging device according to claim 17,
wherein
an n-type organic material is used as a material of the photoelectric conversion layer.

24. The method for manufacturing an imaging device according to claim 23,
wherein
the n-type organic material is a fullerene or a fullerene derivative.

25. The method for manufacturing an imaging device according to claim 23,
wherein
a p-type organic material is further used as a material of the photoelectric conversion layer.

26. The method for manufacturing an imaging device according to claim 25,
wherein
the p-type organic material is a dye or a material not having 5 or more condensed ring structures.

27. The method for manufacturing an imaging device according to claim 25,
wherein
the respective materials constituting the photoelectric conversion layer are selected such that a difference between an electron affinity of the n-type organic material and an ionization potential of the p-type organic material is 1.0 eV or more.

28. The method for manufacturing an imaging device according to claim 25,
wherein
a material having an ionization potential of 5.2 eV or more is used as the p-type organic material.

29. The method for manufacturing an imaging device according to claim 17,
wherein
a material having an own electron spin number of not more than $1.0 \times 10^{15}/cm^3$ is used as the material constituting the photoelectric conversion layer.

30. The method for manufacturing an imaging device according to claim 17,
wherein
a material of the photoelectric conversion layer is selected such that a value of an electron spin number of the photoelectric conversion layer at 60° C. is not more than 3 times the value at 25° C.

* * * * *